(12) United States Patent
Kao et al.

(10) Patent No.: US 12,363,919 B2
(45) Date of Patent: Jul. 15, 2025

(54) CAPACITOR STRUCTURE AND METHOD OF MAKING THE SAME

(71) Applicant: Taiwan Semiconductor Manufacturing Company Limited, Hsinchu (TW)

(72) Inventors: Yun-Feng Kao, Hsinchu (TW); Ming-Yen Chuang, Hsinchu (TW); Katherine H. Chiang, New Taipei (TW); Chien-Hao Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 497 days.

(21) Appl. No.: 17/695,030

(22) Filed: Mar. 15, 2022

(65) Prior Publication Data
US 2023/0019688 A1 Jan. 19, 2023

Related U.S. Application Data

(60) Provisional application No. 63/223,161, filed on Jul. 19, 2021.

(51) Int. Cl.
*H10D 1/00* (2025.01)
*H10D 1/68* (2025.01)

(52) U.S. Cl.
CPC ............ *H10D 1/042* (2025.01); *H10D 1/714* (2025.01); *H10D 1/716* (2025.01)

(58) Field of Classification Search
CPC ......... H01L 28/86; H01L 28/90; H01G 4/005; H10B 12/03; H10B 12/033; H10B 12/30; H10D 1/714; H10D 1/716
See application file for complete search history.

(56) References Cited

U.S. PATENT DOCUMENTS

| 6,100,129 A * | 8/2000 | Tu ............................ H01L 28/82 |
| | | 438/398 |
| 6,624,018 B1 * | 9/2003 | Yu ............................ H01L 28/87 |
| | | 438/243 |
| 2008/0145997 A1* | 6/2008 | Tu ............................ H01L 28/86 |
| | | 438/398 |

* cited by examiner

*Primary Examiner* — Jose R Diaz
(74) *Attorney, Agent, or Firm* — The Marbury Law Group, PLLC

(57) ABSTRACT

A disclosed capacitor structure includes a support structure including a plurality of elongated structures each extending along a longitudinal direction, a transverse direction, and a vertical direction. The plurality of elongated structures includes an alternating stack of first dielectric layers and second dielectric layers, a bottom electrode formed over the support structure, a third dielectric layer formed over the bottom electrode, and a top electrode formed over the third dielectric layer. Each of the first dielectric layers includes a first width along the transverse direction and each of the second dielectric layers includes a second width along the transverse direction. In various embodiments, the first width may be less than the second width such that each of the plurality of elongated structures include walls including a corrugated width profile as a function of distance along the vertical direction. The capacitor structure may be formed in a BEOL process.

20 Claims, 27 Drawing Sheets

CAPACITOR STRUCTURE AND METHOD OF MAKING THE SAME

RELATED APPLICATION

This application claims priority to U.S. Provisional Patent Application No. 63/223,161 entitled "Semiconductor Structure and Method of Manufacturing the Same" filed on Jul. 19, 2021, the entire contents of which are hereby incorporated by reference for all purposes.

BACKGROUND

The semiconductor industry has grown due to continuous improvements in integration density of various electronic components (e.g., transistors, diodes, resistors, inductors, capacitors, etc.). For the most part, these improvements in integration density have come from successive reductions in minimum feature size, which allow more components to be integrated into a given area. In this regard, individual transistors, interconnects, and related structures have become increasingly smaller and there is an ongoing need to develop new materials, processes, and designs of semiconductor devices and interconnects to allow further progress.

Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques may not damage previously fabricated front-end-of-line (FEOL) and middle end-of-line (MEOL) devices. Circuits based on TFT devices may further include other components that may be fabricated in a BEOL process, such as capacitors, inductors, resistors, and integrated passive devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
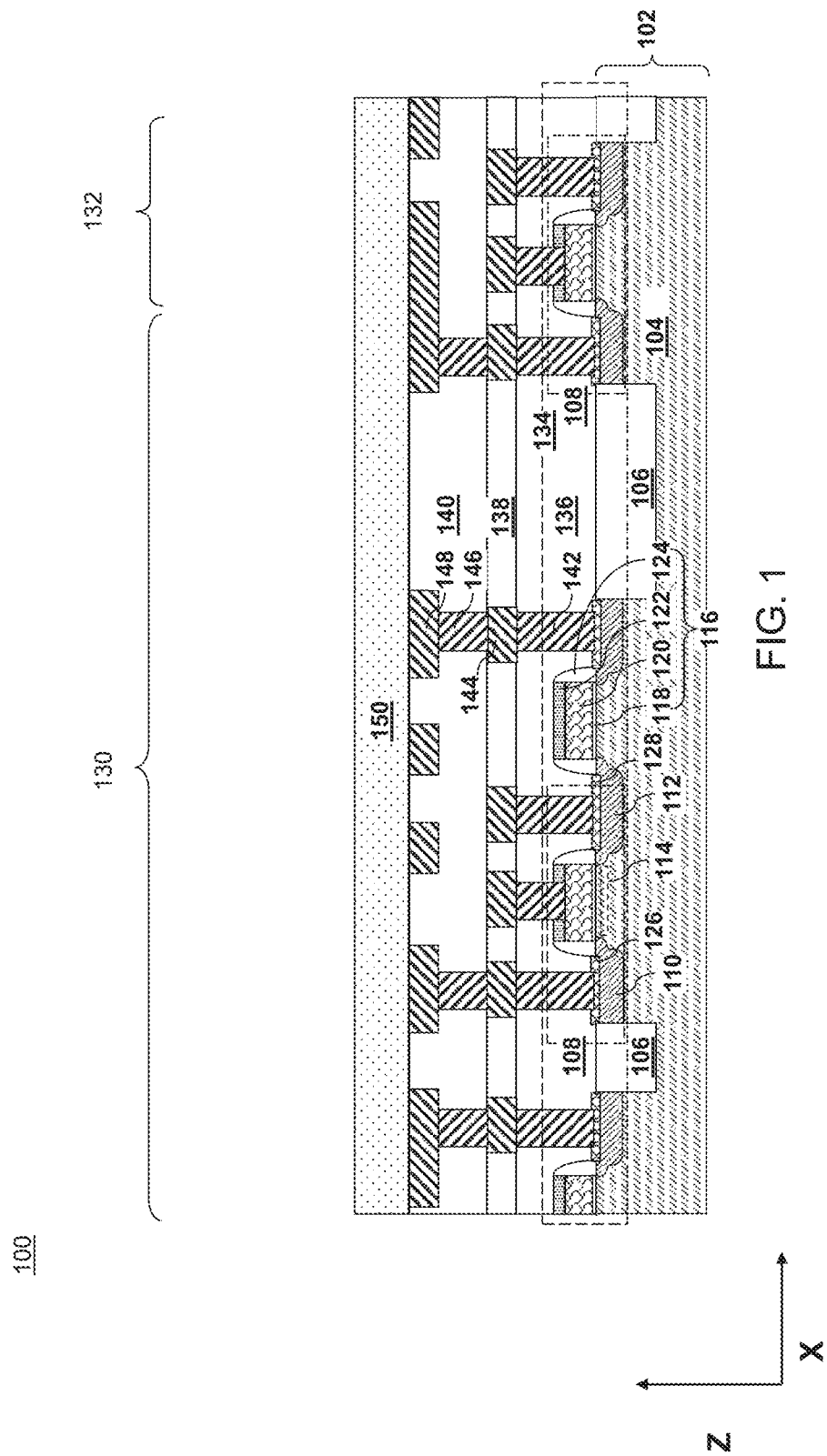
FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer, according to various embodiments.

The following disclosure provides many different embodiments, or examples, for implementing different features of the provided subject matter. Specific examples of components and arrangements are described below to simplify this disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, this disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

According to various embodiments of this disclosure, a capacitor structure is provided that may be formed in a BEOL process and may be incorporated with other BEOL circuit components such as TFT devices. As such, the disclosed capacitor structure may include materials that may be processed at low temperatures and thus, may not damage previously fabricated devices (e.g., FEOL and MEOL devices).

The disclosed embodiment capacitor structures may include a support structure including a plurality of elongated structures each extending along a longitudinal direction, a transverse direction, and a vertical direction. The plurality of elongated structures may include an alternating dielectric stack of first dielectric layers and second dielectric layers. The disclosed capacitor structure may further include a bottom electrode formed over the support structure, a third dielectric layer formed over the bottom electrode, and a top electrode formed over the third dielectric layer. Each of the first dielectric layers may include a first width along the transverse direction and a first height along the vertical direction, and each of the second dielectric layers may include a second width along the transverse direction and a second height along the vertical direction. In various embodiments, the first width may be less than the second width such that each of the plurality of elongated structures includes walls including a corrugated width profile as a function of distance along the vertical direction.

FIG. 1 illustrates a first exemplary semiconductor structure 100, according to various embodiments. The first exemplary structure 100 includes a substrate 102, which may be a semiconductor substrate such as a commercially available silicon substrate. The substrate 102 may include a semiconductor material layer 104 at least at an upper portion thereof. The semiconductor material layer 104 may be a surface portion of a bulk semiconductor substrate, or may be a top semiconductor layer of a semiconductor-on-insulator (SOI) substrate. In one embodiment, the semiconductor material layer 104 includes a single crystalline semiconductor material such as single crystalline silicon. In one embodiment, the substrate 102 may include a single crystalline silicon substrate including a single crystalline silicon material.

Shallow trench isolation structures 106 including a dielectric material such as silicon oxide may be formed in an upper portion of the semiconductor material layer 104. Suitable doped semiconductor wells, such as p-type wells and n-type wells, may be formed within each area that is laterally enclosed by a portion of the shallow trench isolation structures 106. Field effect transistors 108 may be formed over the top surface of the semiconductor material layer 104. For example, each field effect transistor 108 may include a source electrode 110, a drain electrode 112, a semiconductor channel 114 that includes a surface portion of the substrate 102 extending between the source electrode 110 and the drain electrode 112, and a gate structure 116. The semiconductor channel 114 may include a single crystalline semiconductor material. Each gate structure 116 may include a gate dielectric layer 118, a gate electrode 120, a gate cap dielectric 122, and a dielectric gate spacer 124. A source-side metal-semiconductor alloy region 126 may be formed on each source electrode 110, and a drain-side metal-semiconductor alloy region 128 may be formed on each drain electrode 112.

The first exemplary structure may include a memory array region 130 in which an array of memory cells may be subsequently formed. The first exemplary structure may further include a peripheral region 132 in which metal wiring for the array of ferroelectric memory devices is provided. Generally, the field effect transistors 108 in the CMOS circuitry 134 may be electrically connected to an electrode of a respective ferroelectric memory cell by a respective set of metal interconnect structures.

Devices (such as field effect transistors 108) in the peripheral region 132 may provide functions that operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 104 may include complementary metal-oxide-semiconductor (CMOS) transistors and optionally additional semiconductor devices (such as resistors, diodes, capacitors, etc.), and are collectively referred to as CMOS circuitry 134.

One or more of the field effect transistors 108 in the CMOS circuitry 134 may include a semiconductor channel 114 that contains a portion of the semiconductor material layer 104 in the substrate 102. If the semiconductor material layer 104 includes a single crystalline semiconductor material such as single crystalline silicon, the semiconductor channel 114 of each field effect transistor 108 in the CMOS circuitry 134 may include a single crystalline semiconductor channel such as a single crystalline silicon channel. In one embodiment, a plurality of field effect transistors 108 in the CMOS circuitry 134 may include a respective node that is subsequently electrically connected to a node of a respective ferroelectric memory cell to be subsequently formed. For example, a plurality of field effect transistors 108 in the CMOS circuitry 134 may include a respective source electrode 110 or a respective drain electrode 112 that is subsequently electrically connected to a node of a respective ferroelectric memory cell to be subsequently formed.

In one embodiment, the CMOS circuitry 134 may include a programming control circuit configured to control gate voltages of a set of field effect transistors 108 that may be used for programming a respective memory cell (e.g., a ferroelectric memory cell) and to control gate voltages of transistors (e.g., TFTs) to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 102 may include a single crystalline silicon substrate, and the field effect transistors 108 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the disclosure, the field effect transistors 108 may be subsequently electrically connected to drain electrodes and gate electrodes of access transistors including semiconducting metal oxide plates to be formed above the field effect transistors 108. In one embodiment, a subset of the field effect transistors 108 may be subsequently electrically connected to at least one of the drain electrodes and the gate electrodes. For example, the field effect transistors 108 may include first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 108 may include bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 102 and the semiconductor devices thereupon (such as field effect transistors 108). In an illustrative example, the dielectric material layers may include, for example, a first dielectric material layer 136 that may be a layer that surrounds the contact structure connected to the source and drains (sometimes referred to as a contact-level dielectric material layer 136), a first interconnect-level dielectric material layer 138, and a second interconnect-level dielectric material layer 140. The metal interconnect structures may include device contact via structures 142 formed in the first dielectric material layer 136 and contacting a respective component of the CMOS circuitry 134, first metal line structures 144 formed in the first interconnect-level dielectric material layer 138, first metal via structures 146 formed in a lower portion of the second interconnect-level dielectric material layer 140, and second metal line structures 148 formed in an upper portion of the second interconnect-level dielectric material layer 140.

Each of the dielectric material layers (136, 138, 140) may include a dielectric material such as undoped silicate glass, a doped silicate glass, organosilicate glass, amorphous fluorinated carbon, porous variants thereof, or combinations thereof. Each of the metal interconnect structures (142, 144, 146, 148) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 146 and the second metal line structures 148 may be formed as integrated line and via structures by a dual damascene process. The dielectric material layers (136, 138, 140) are herein referred to as lower-level dielectric material layers. The metal interconnect structures (142, 144, 146, 148) formed within in the lower-level dielectric material layers are herein referred to as lower-level metal interconnect structures.

While the disclosure is described using an embodiment in which an array of memory cells may be formed over the second line-and-via-level dielectric material layer 140, embodiments are expressly contemplated herein in which the array of memory cells may be formed at a different metal interconnect level.

An array of thin film transistors and an array of ferroelectric memory cells (or other types of memory cells) may be subsequently deposited over the dielectric material layers (136, 138, 140) that have formed therein the metal interconnect structures (142, 144, 146, 148). The set of all dielectric material layer that are formed prior to formation of an array of thin film transistors or an array of ferroelectric memory cells is collectively referred to as lower-level dielectric material layers (136, 138, 140). The set of all metal interconnect structures that is formed within the lower-level dielectric material layers (136, 138, 140) is herein referred to as first metal interconnect structures (142, 144, 146, 148). Generally, first metal interconnect structures (142, 144, 146, 148) formed within at least one lower-level dielectric material layer (136, 138, 140) may be formed over the semiconductor material layer 104 that is located in the substrate 102.

According to an embodiment of the disclosure, thin film transistors (TFTs) may be subsequently formed in a metal interconnect level that overlies that metal interconnect levels that contain the lower-level dielectric material layers (136, 138, 140) and the first metal interconnect structures (142, 144, 146, 148). In one embodiment, a planar dielectric material layer having a uniform thickness may be formed over the lower-level dielectric material layers (136, 138, 140). The planar dielectric material layer is herein referred to as an insulating matrix layer 150. The insulating matrix layer 150 may include a dielectric material such as undoped silicate glass, a doped silicate glass, organosilicate glass, or a porous dielectric material, and may be deposited by chemical vapor deposition. The thickness of the insulating matrix layer 150 may be in a range from 20 nm to 300 nm, although lesser and greater thicknesses may also be used.

Generally, interconnect-level dielectric layers (such as the lower-level dielectric material layer (136, 138, 140)) containing therein the metal interconnect structures (such as the first metal interconnect structures (142, 144, 146, 148)) may be formed over semiconductor devices. The insulating matrix layer 150 may be formed over the interconnect-level dielectric layers. Other passive devices may be formed in BEOL processes. For example various capacitor structures may be utilized with other BEOL devices.

Figure 2:
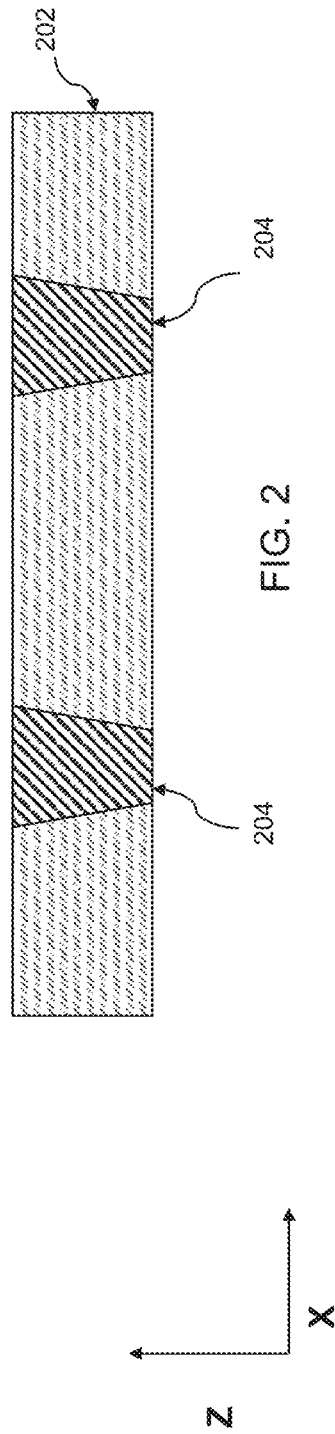
FIG. 2 is a vertical cross-sectional view of an intermediate structure that may be used in the formation of a capacitor structure, according to various embodiments.

FIG. 2 is a vertical cross-sectional view of an intermediate structure 200 that may be used in the formation of a capacitor structure, according to various embodiments. The intermediate structure 200 may include a substrate 202 which may be formed in a BEOL process. As such, the substrate 202 may be a dielectric layer (e.g., an inter-layer dielectric or insulating matrix layer 150 from FIG. 1) that may embed one or more interconnect structures 204. The one or more interconnect structures 204 may be electrically connected to various other interconnect structures (e.g., first metal interconnect structures (142, 144, 146, 148) in FIG. 1) formed below the substrate 202. Each of the one or more interconnect structures 204 may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used.

The substrate 202 may include, for example, undoped silicate glass, a doped silicate glass (e.g., deposited by decomposition of tetraethylorthosilicate (TEOS)), organosilicate glass, silicon oxynitride, or silicon carbide nitride. Other dielectric materials are within the contemplated scope of disclosure. The dielectric material of the substrate 202 may be deposited by a conformal deposition process (such as a chemical vapor deposition process) or a self-planarizing deposition process (such as spin coating). The thickness of the substrate 202 may be in a range from approximately 15 nm to approximately 60 nm, such as from approximately 20 nm to approximately 40 nm, although smaller and larger thicknesses may also be used.

Formation of the one or more interconnect structures 204 may be completed by depositing a mask layer over the substrate 202 and performing various photolithographic steps to etch a via in the substrate 202. Deposition of the at least one conductive material, which may be a combination of a metallic liner layer (such as a metallic nitride or a metallic carbide) and a metallic fill material may be performed by any of a variety of deposition techniques such as physical vapor deposition (PVD), chemical vapor deposition (CVD) or a self-planarizing deposition process (such as spin coating). Other conformal deposition processes may include plasma enhanced chemical vapor deposition (PECVD), atomic layer deposition (ALD), physical vapor deposition (PVD), a high density plasma CVD (HDPCVD) process, a metalorganic CVD (MOCVD) process, a sputtering process, laser ablation, etc.

Figure 3:
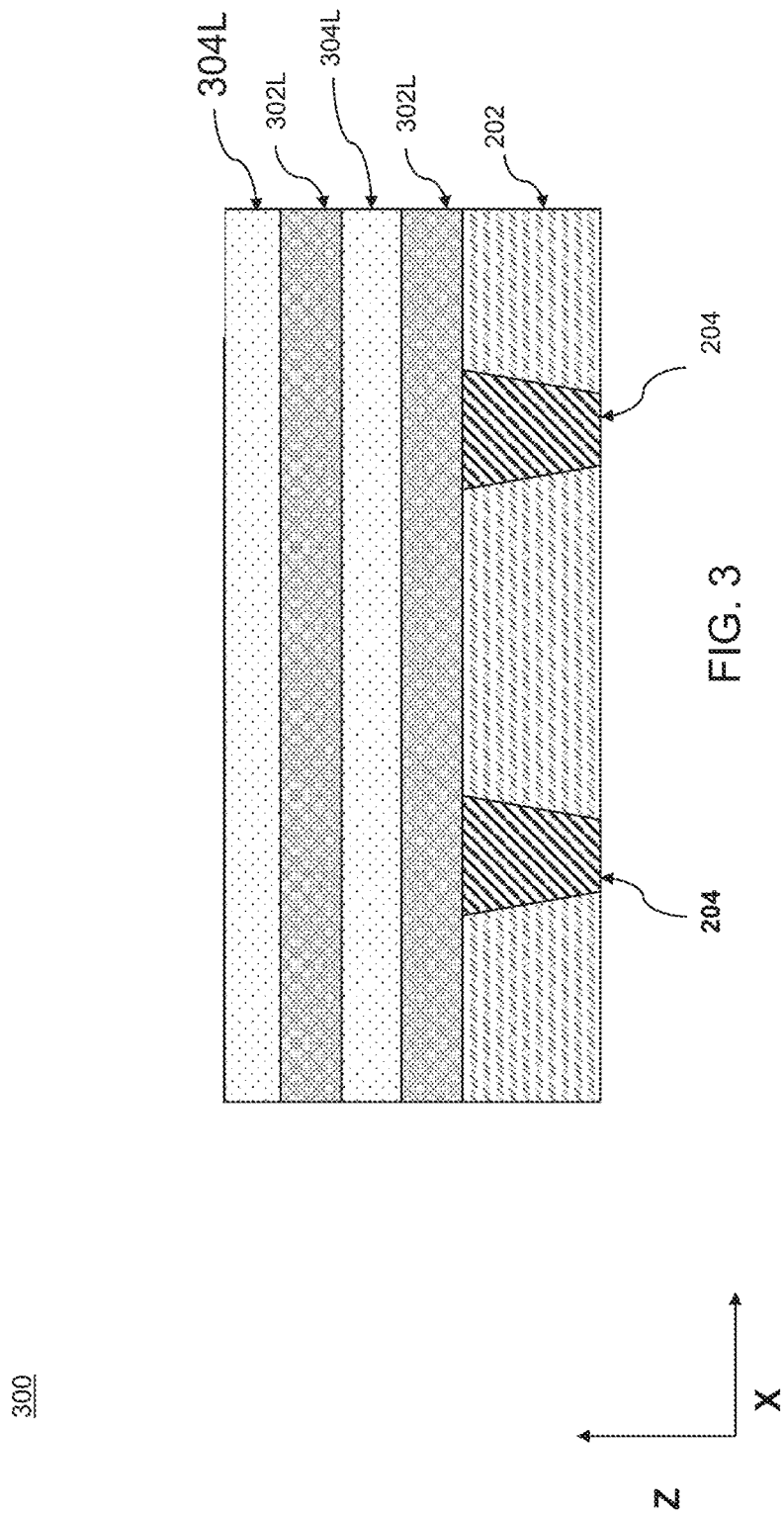
FIG. 3 is a vertical cross-sectional view of a further intermediate structure that may be used in the formation of a capacitor structure, according to various embodiments.

FIG. 3 is a vertical cross-sectional view of a further intermediate structure 300 that may be used in the formation of a capacitor structure, according to various embodiments. The intermediate structure 300 may be formed by depositing a plurality of dielectric layers over the intermediate structure 200 of FIG. 2. In this regard, an alternating stack of dielectric layers may be formed by depositing a first dielectric layer 302L followed by a second dielectric layer 304L. The processes may be repeated one or more times to thereby generate the intermediate structure 300. In this example, the first dielectric layer 302L and the second dielectric layer 304L may be formed as planar blanket (i.e., un-patterned) layers each having a respective planar top surface and a respective planar bottom surface. Further, each of the dielectric layers may have a common thickness. In other example embodiments, the thickness of the first dielectric layer 302L and the second dielectric layer 304L may be different or the thickness of the various dielectric layers may vary with vertical distance, as described below.

Each of the first dielectric layer 302L and the second dielectric layer 304L may include be formed of a suitable dielectric material, such as silicon dioxide ($SiO_2$) silicon nitride (SiN, $Si_3N_4$), silicon carbide (SiC), undoped silicate glass, a doped silicate glass, organosilicate glass, amorphous fluorinated carbon, porous variants thereof, or combinations thereof. Other insulator materials are within the contemplated scope of disclosure.

Each of the first dielectric layer 302L and the second dielectric layer 304L may be deposited by a conformal deposition process (such as low pressure chemical vapor deposition (CVD)) or a self-planarizing deposition process (such as spin coating). Other conformal deposition processes may include plasma enhanced chemical vapor deposition (PECVD), atomic layer deposition (ALD), physical vapor deposition (PVD), a high density plasma CVD (HDPCVD) process, a metalorganic CVD (MOCVD) process, a sputtering process, laser ablation, etc. Excess portions of the deposited second dielectric layer 304L may be removed from above the top surface of the intermediate structure 300 by a planarization process, for example, by chemical mechanical planarization (CMP).

Figure 4:
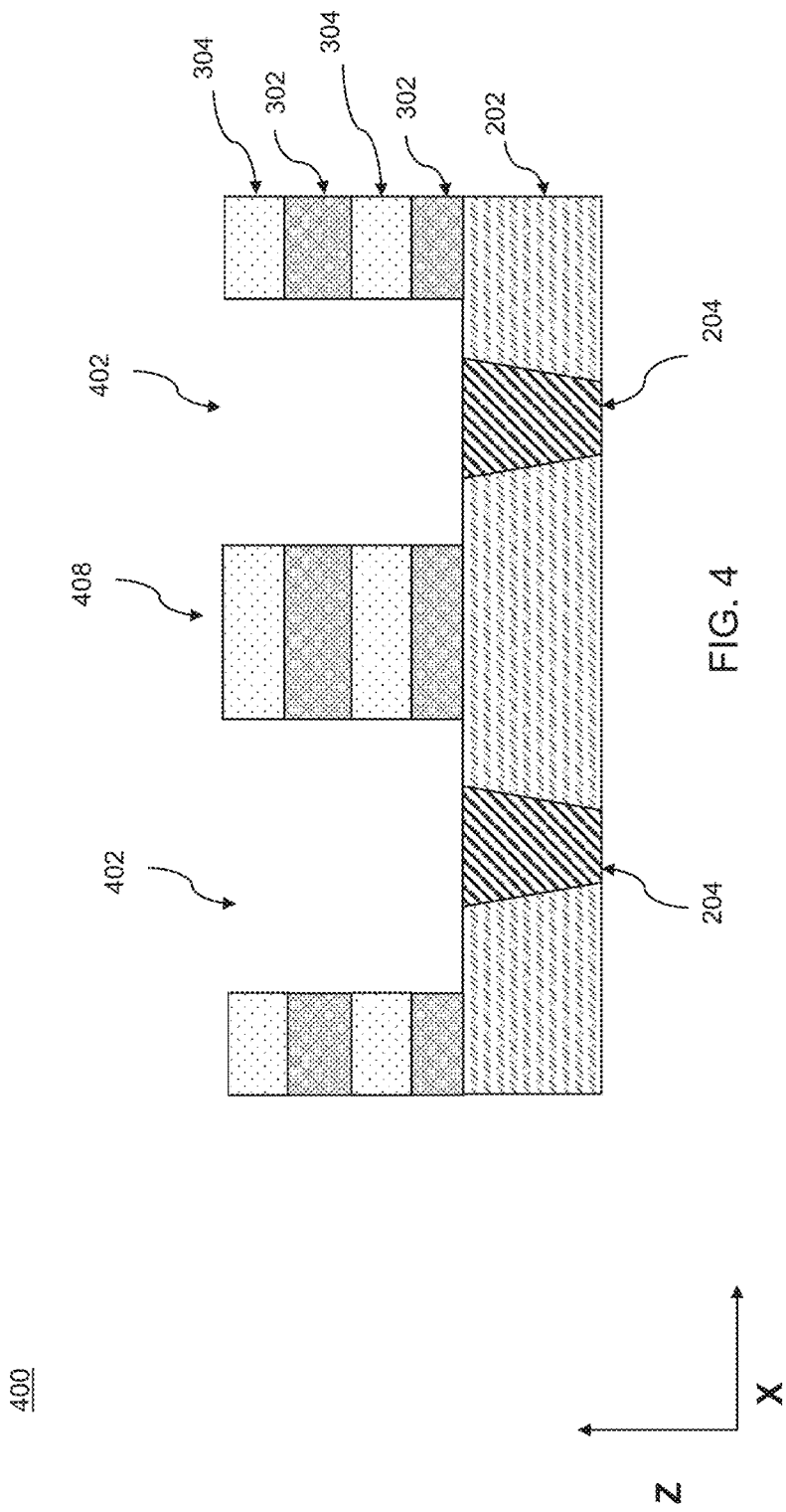
FIG. 4 is a vertical cross-sectional view of a further intermediate structure that may be used in the formation of a capacitor structure, according to various embodiments.

FIG. 4 is a vertical cross-sectional view of a further intermediate structure 400 that may be used in the formation of a capacitor structure, according to various embodiments. The intermediate structure 400 may be formed by performing an anisotropic etch on the intermediate structure 300 of FIG. 3 to remove portions of the alternating stack of dielectric layers. In this regard, a photoresist (not shown) may be deposited over the intermediate structure 300 of FIG. 3. The photoresist may then be patterned using photolithography techniques to generate openings in the photoresist.

The patterned photoresist may then be used as a mask for patterning the alternating stack of dielectric layers. In this regard, an anisotropic etch process may be performed to remove regions the first dielectric layer 302L and the second dielectric layer 304L in each pair of layers in the alternating stack of dielectric layers to thereby generate a plurality of trenches 402, as shown in FIG. 4. After etching, any residual photoresist may be removed by ashing or by dissolution with a solvent.

As shown in FIG. 4, the etching process may generate trenches 402 that may be separated from one another by remaining portions 408 of the alternating stack of dielectric layers. As shown, each of the remaining portions 408 includes a patterned first dielectric layer 302 and a patterned second dielectric layer 304. Each of the remaining portions 408 forms an elongated structure that extends in a longitudinal direction (i.e., into the plane of FIG. 4), in a transverse direction (i.e., along direction X in FIG. 4) and in a vertical direction (i.e., along direction Z in FIG. 4). The etching process, described above, may be performed to thereby etch down to, and to expose a top surface of, each of the interconnect structures 204.

Figure 5:
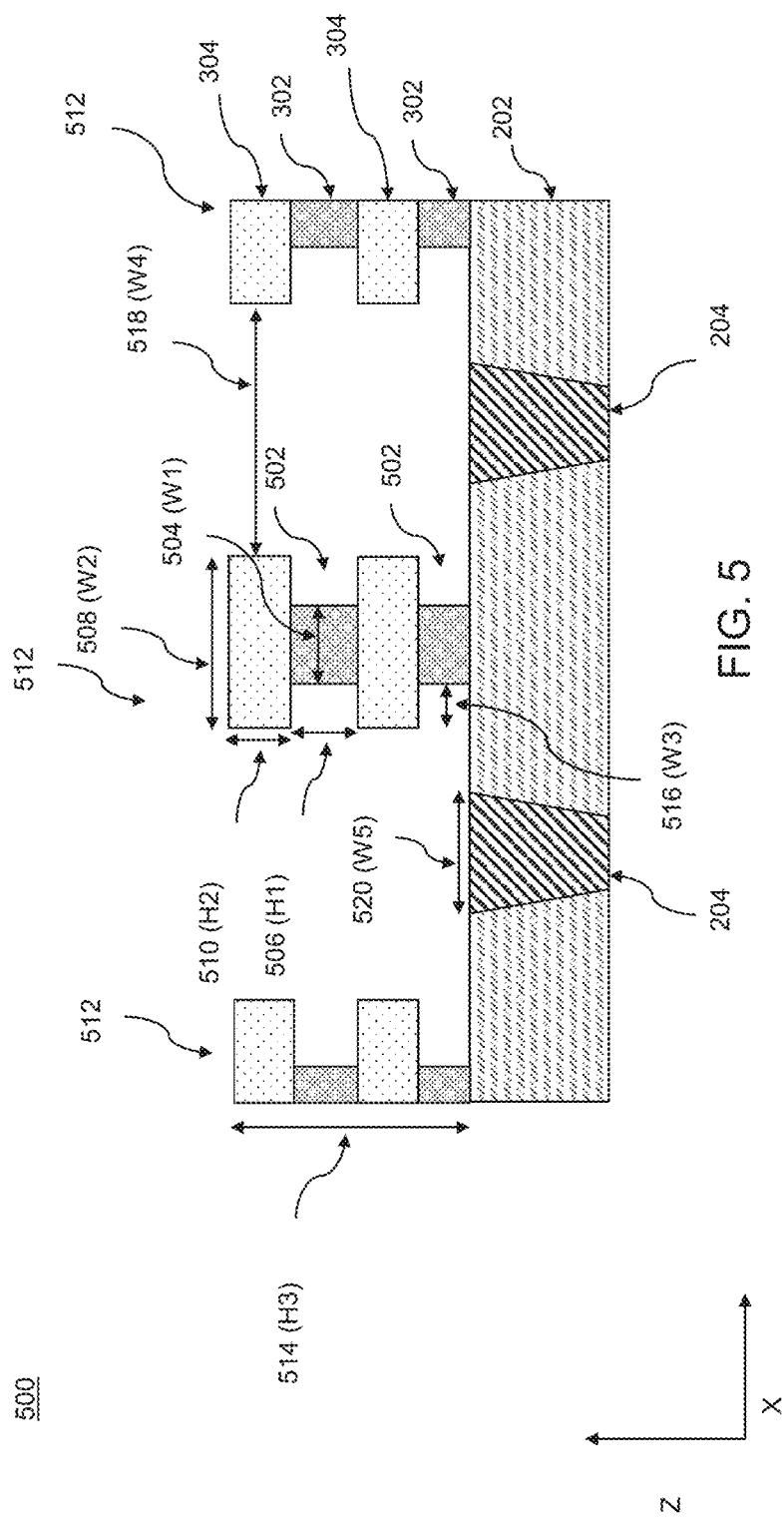
FIG. 5 is a vertical cross-sectional view of a further intermediate structure that may be used in the formation of a capacitor structure, according to various embodiments.

FIG. 5 is a vertical cross-sectional view of a further intermediate structure that may be used as a support structure 500 in the formation of a capacitor structure, according to various embodiments. The support structure 500 may be formed by performing a selective etching process to thereby form a plurality of notches 502 in the stack of first dielectric layers 302 and second dielectric layers 304. In this regard, the first dielectric layer 302 may include a material that may be etched to a greater degree than a material of the second dielectric layer 304. For example, the first dielectric layer 302 may include silicon oxide while the second dielectric layer 304 may include silicon nitride. Other suitable dielectric materials within the contemplated scope of disclosure may also be used for the first dielectric layer 302 and the second dielectric layer 304.

As shown in FIG. 5, each of the first dielectric layers 302 extends along the longitudinal direction (i.e., into the plane of FIG. 5 along a y-direction) and includes a first width W1 504 along the transverse direction (i.e., along the direction X in FIG. 5) and a first height H1 506 along the vertical direction (i.e., along the direction Z in FIG. 5). In some embodiments, the first height H1 506 may be in a range from approximately 20 nm to approximately 50 nm. Further, each of the second dielectric layers 304 extends along the longitudinal direction (i.e., into the plane of FIG. 5 along a y-direction) and includes a second width W2 508 along the transverse direction (i.e., along the direction X in FIG. 5) and a second height H2 510 along the vertical direction (along a z-direction in FIG. 5). In some embodiments, the second height H2 510 may be greater than 20 nm. As shown in FIG. 5, the first width W1 504 may be less than the second width W2 508 such that the support structure 500 of FIG. 5 includes a plurality of elongated structures 512 (i.e., extending along the longitudinal direction) that each include walls having a corrugated width profile as a function of distance along the vertical direction. In some embodiments, the second width W2 508 may be greater than 10 nm. The dimensions (W1,W2,H1,H2) of the first dielectric layer 302 and the second dielectric layer 304 may take on a wide range of values based on process limitations and design considerations for specific applications, as described in greater detail below. For example, H1 may be chosen to satisfy H1>2* (T1+T2), where T1 is a thickness of a bottom electrode 602 (e.g., see FIG. 7) and T2 is a thickness of a dielectric layer 802 (e.g., see FIG. 8) to be subsequently formed, as described in greater detail with reference to FIGS. 7 to 9, below.

As shown in FIG. 5, the corrugated width profile may include the plurality of notches 502 formed between adjacent ones of the second dielectric layers 304. Each of the plurality of notches 502 may have a third width W3 516 that may be approximately equal to a difference W3=W2−W1 between the second width W2 508 and the first width W1 504. Further, each notch 502 may have a height that is approximately equal to the first height H1 506. In an example embodiment, the first width W1 504 may be greater than or approximately equal to 10 nm and the third width W3 516 may be greater than or approximately equal to 15 nm. In other embodiments, the first width W1 504 and the third width W3 516 may have various other values. The support structure 500 of FIG. 5 may include the plurality of elongated structures 512, along with portions of the substrate 202 between the elongated structures 512 including the interconnect structures 204.

As shown in FIG. 5, the plurality of elongated structures 512 may be formed on the substrate 202 such that each of the plurality of elongated structures 512 may have a third height H3 514. Further, adjacent ones of the plurality of elongated structures 512 may be separated by a fourth width W4 518. Each of interconnect structures may have a fifth width W5 520 that may be less than the fourth width W4 518. Further, the fourth width W4 518 may be greater than or approximately equal to 20 nm. The various dimensions (H1,H2,H3, W1,W2,W3,W4,W5) of the elongate structures may take on a wide range of values depending on process limitations and design considerations for specific applications so long as W4>W5 and H3 is approximately a multiple of H1+H2.

Figure 6:
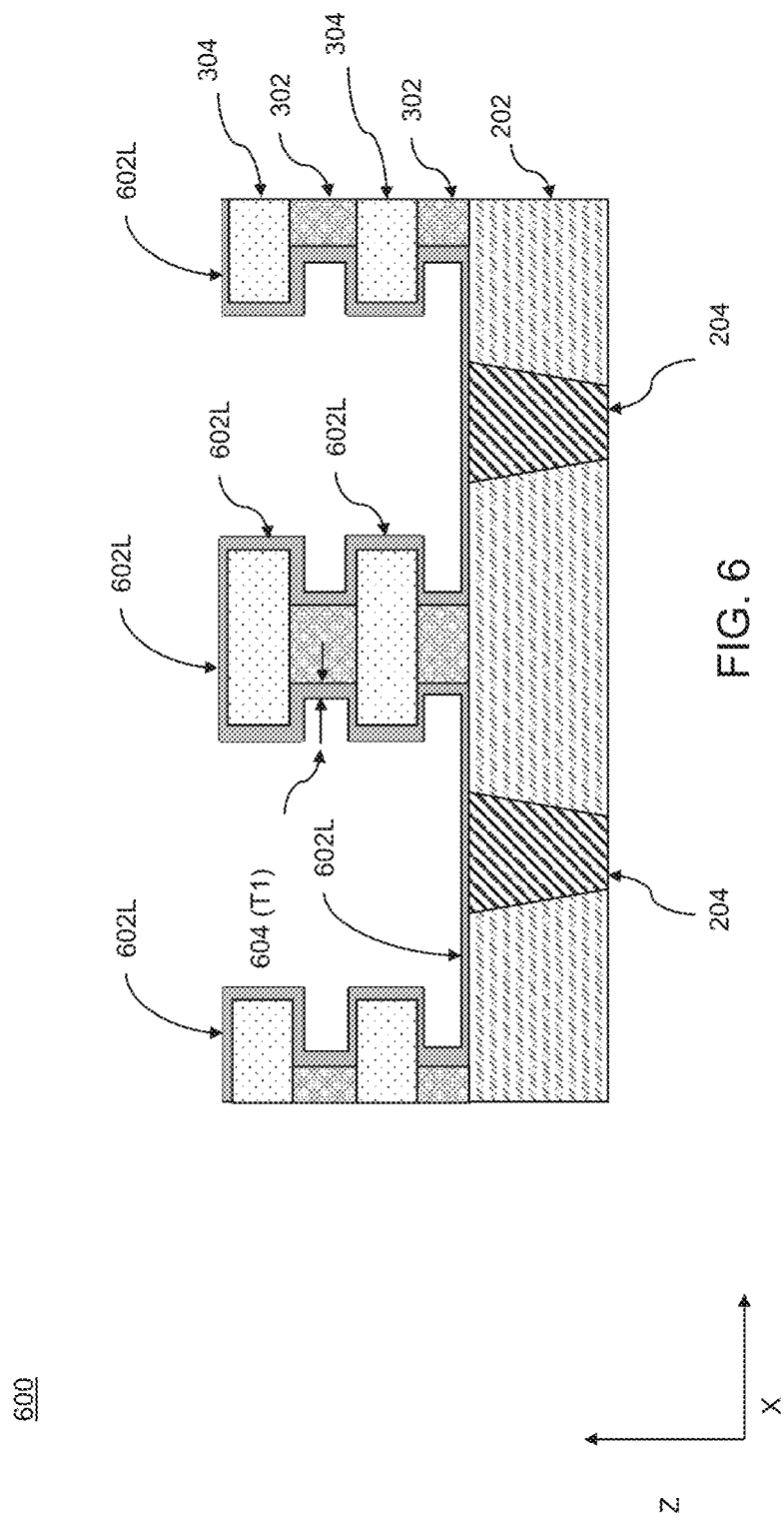
FIG. 6 is a vertical cross-sectional view of a further intermediate structure that may be used in the formation of a capacitor structure, according to various embodiments.

FIG. 6 is a vertical cross-sectional view of a further intermediate structure 600 that may be used in the formation of a capacitor structure, according to various embodiments. The intermediate structure 600 may be formed by depositing a conductive layer 602L over the support structure 500 of FIG. 5. The conductive layer 602L may include a conductive metallic nitride or a conductive metallic carbide such as TiN, TaN, WN, TiC, TaC, and/or WC. Other suitable conductive materials within the contemplated scope of this disclosure may also be used. The conductive layer 602L may be deposited to thereby form an electrically conductive contact with the interconnect structures 204. The conductive layer 602L may be deposited by any suitable technique, such as CVD, PECVD, ALD, etc. As shown, the conductive layer 602L may have a thickness T1 604. In certain embodiments, the thickness Ti 604 may be greater than 3 nm.

Figure 7:
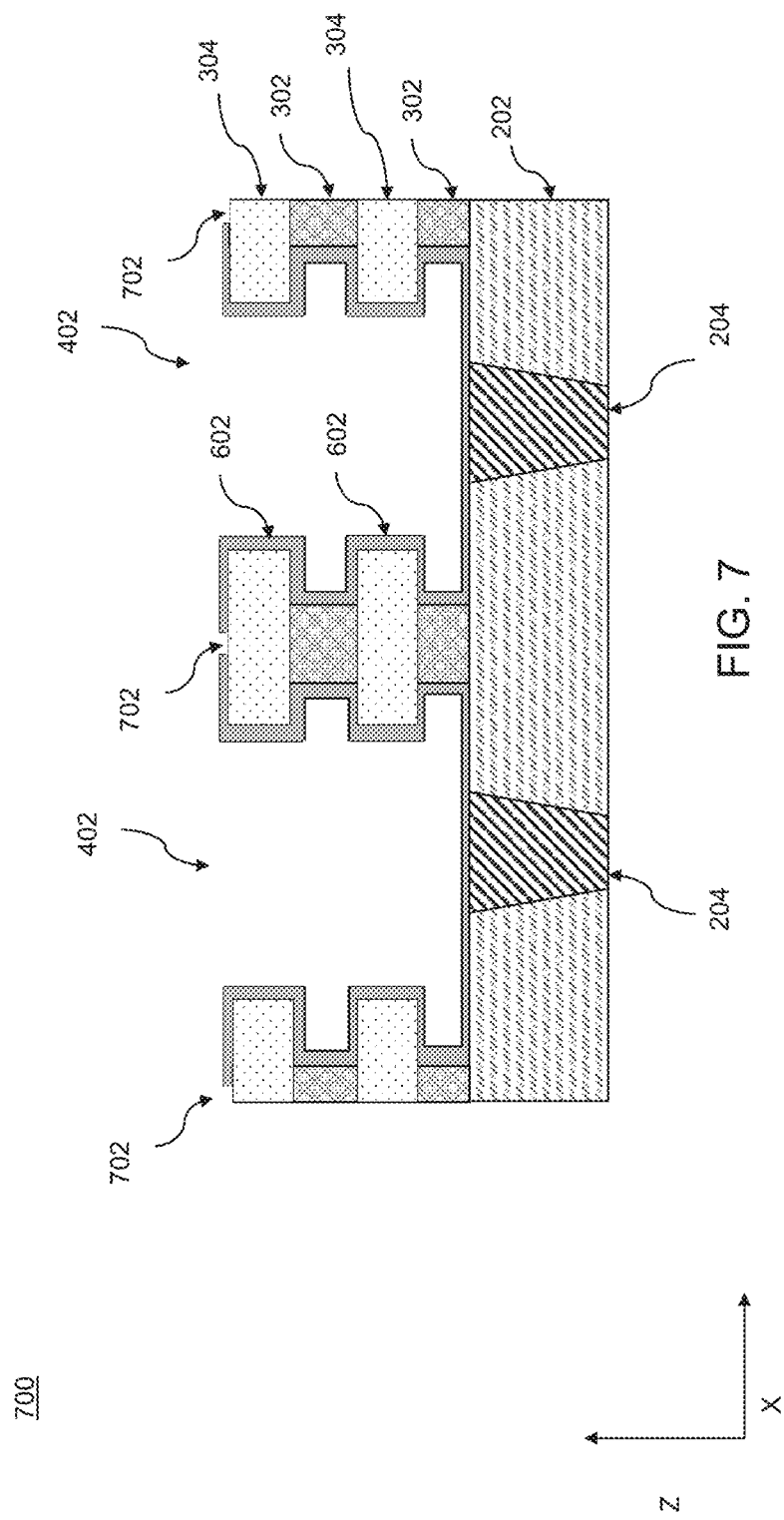
FIG. 7 is a vertical cross-sectional view of a further intermediate structure that may be used in the formation of a capacitor structure, according to various embodiments.

FIG. 7 is a vertical cross-sectional view of a further intermediate structure 700 that may be used in the formation of a capacitor structure, according to various embodiments. The intermediate structure 700 may be formed by patterning the conductive layer 602L (e.g., see FIG. 6) to thereby form gaps 702 between portions of the conductive layer 602L in adjacent trenches 402. In this regard, a photoresist (not shown) may be deposited over the intermediate structure 600 of FIG. 6. The photoresist may then be patterned using photolithography techniques to generate openings in the photoresist. The patterned photoresist may then be used as a mask for patterning the conductive layer 602L. In this regard, an etch process may be performed to remove portions of the conductive layer 602L to thereby generate the gaps 702, as shown in FIG. 7. After etching, any residual photoresist may be removed by ashing or by dissolution with a solvent. As such, the patterned conductive layer 602L may form a bottom electrode 602 for a capacitor structure to be formed subsequently.

Figure 8:
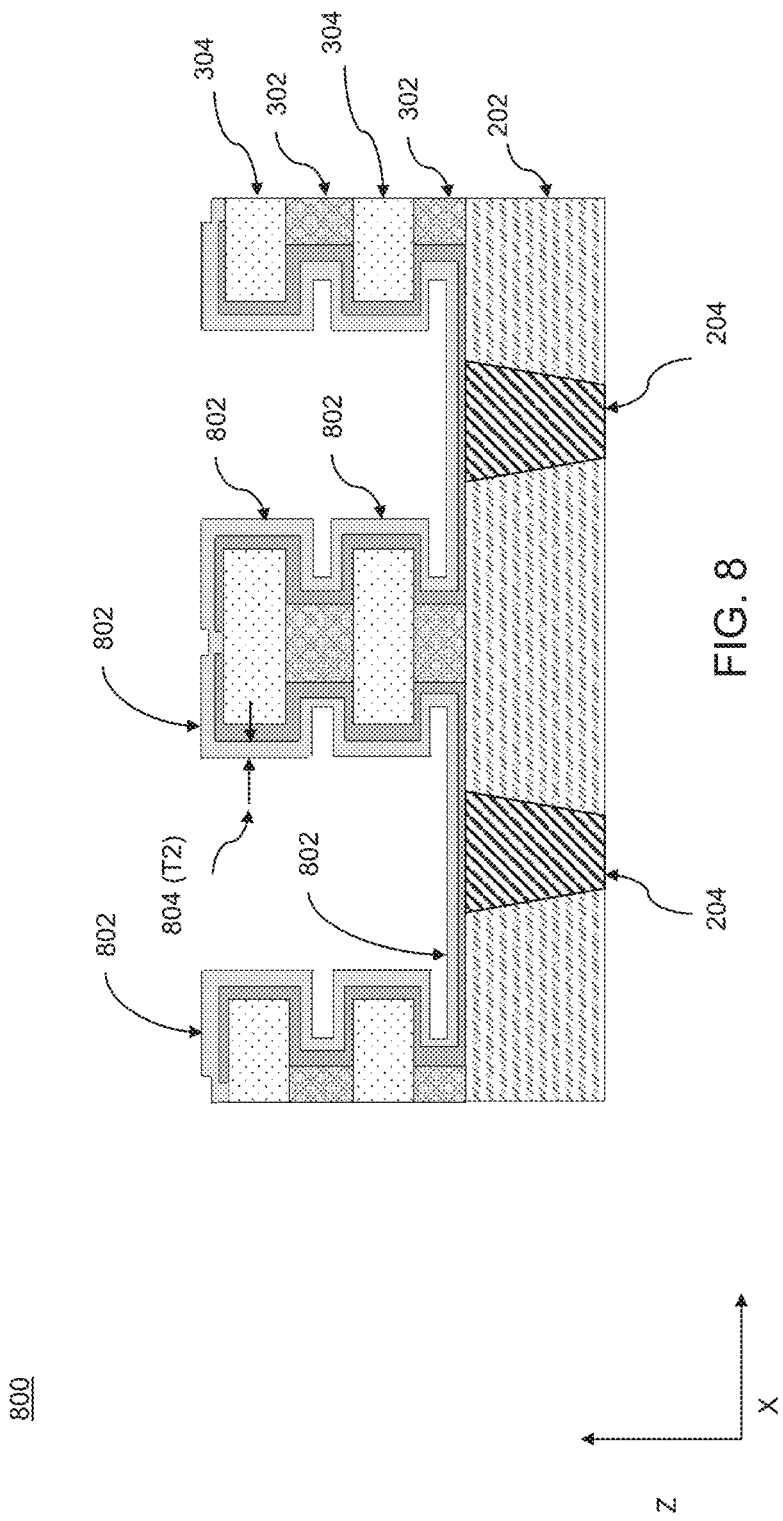
FIG. 8 is a vertical cross-sectional view of a further intermediate structure that may be used in the formation of a capacitor structure, according to various embodiments.

FIG. 8 is a vertical cross-sectional view of a further intermediate structure 800 that may be used in the formation of a capacitor structure, according to various embodiments. The intermediate structure 800 may be formed by deposition of a first high-k dielectric layer 802 over the intermediate structure 700 of FIG. 7. According to an embodiment, the first high-k dielectric layer 802 may be conformally deposited and may include a high-k dielectric material including, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, and hafnium dioxide-alumina ($HfO_2$—$Al_2O_3$). Other suitable dielectric materials are within the contemplated scope of disclosure. In various embodiments, the first high-k dielectric layer 802 may have a thickness T2 804 that may be in a range from approximately 3 nm to approximately 10 nm. Other embodiments may include a high-k dielectric having a larger or smaller thicknesses.

Figure 9:
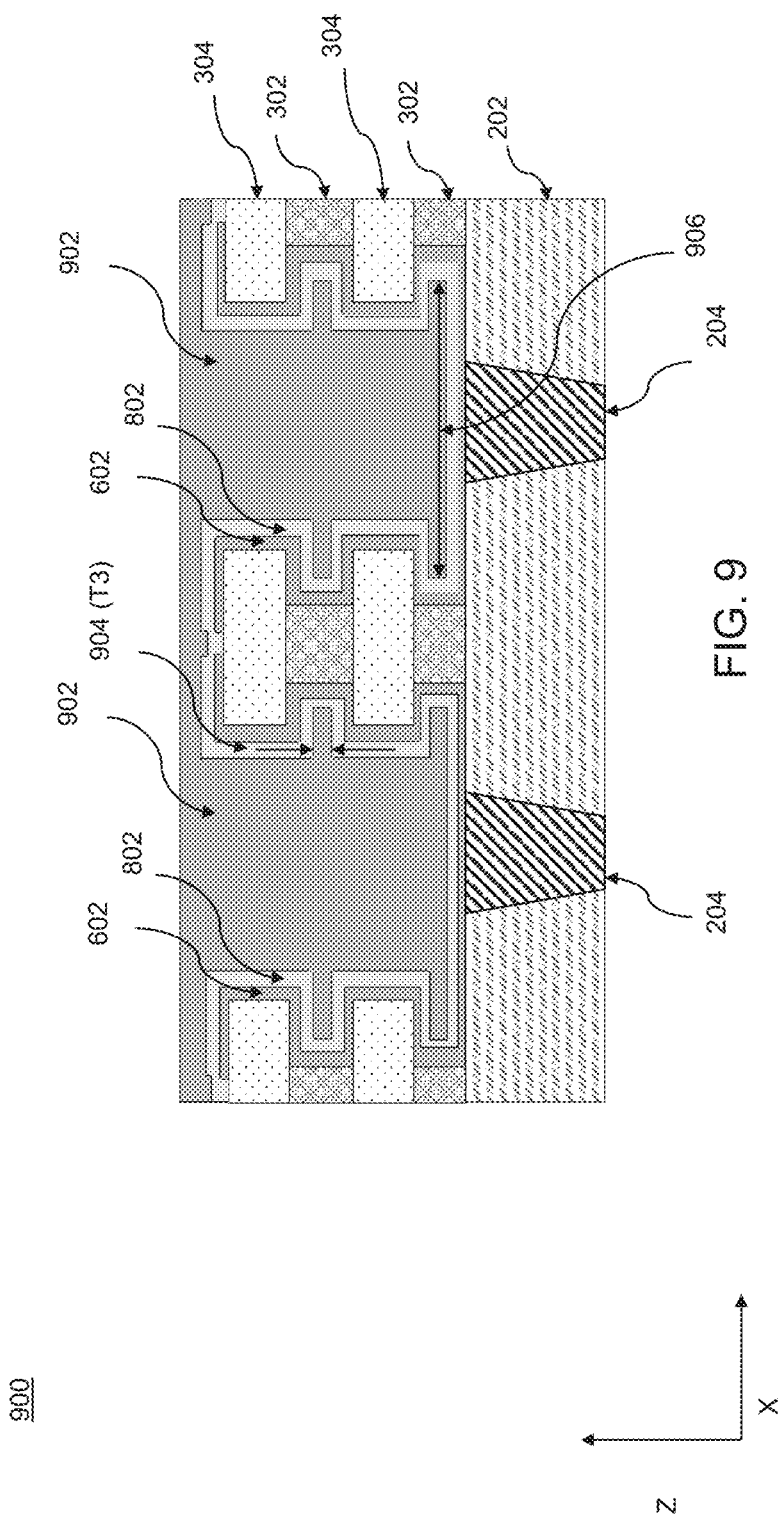
FIG. 9 is a vertical cross-sectional view of a capacitor structure, according to various embodiments.

FIG. 9 is a vertical cross-sectional view of a capacitor structure 900, according to various embodiments. The capacitor structure 900 may be formed by deposition of a conductive material to form a top electrode 902 over the intermediate structure 800 of FIG. 8. The top electrode 902 may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable conductive materials within the contemplated scope of this disclosure may also be used.

As shown in FIG. 9, the top electrode 902 and the bottom electrode 602 may be separated by the first high-k dielectric layer 802. The top electrode 902 may have portions having a thickness T3 904 extending into the notches 502 (e.g., see FIGS. 5 and 9). The thickness T1 604 of the bottom electrode 602 (e.g., see FIG. 6), the thickness T2 of the first high-k dielectric layer 802 (e.g., see FIG. 8), and the thickness T3 904 of the portion of the top electrode 902 may be configured to satisfy W3>T1+T2+T3, and H1>2 T1+2 T2+T3, where W3 516 is the width of the notches 502, and H1 506 is the height of the notches 502 (e.g., see FIG. 5).

These conditions on T1, T2, T3, H1, and W3 ensure that the multi-layer structure including the bottom electrode 602, the first high-k dielectric layer 802, and the conductive material of the top electrode 902, extend into the notches 502 of the capacitor structure 900, as shown in FIG. 9. In this regard, the top electrode layer may include portions extending into the notches 502 such that a width 906 of a bottom surface of the top electrode 902 is greater than a width 518 (e.g., see FIG. 4) of the trench 402 (e.g., see FIGS. 4 and 9) before etching to form the notches 502 (e.g., see FIG. 5).

In various embodiments, the top electrode 902 and the bottom electrode 602 may include the same materials, while in other embodiments, the top electrode 902 and the bottom electrode 602 may include different materials. Further, the thickness T2 of the first high-k dielectric layer 802 may be greater than that thickness T3 of the bottom electrode 602. In other embodiments, the thickness T2 of the first high-k dielectric layer 802 may be smaller than the thickness T1 of the bottom electrode 602. In further embodiments, the bottom electrode 602, the first high-k dielectric layer 802, and the top electrode 902 may each have the same thickness T1=T2=T3. In other embodiments, the bottom electrode 602, the first high-k dielectric layer 802, and the top electrode 902 may have different thicknesses.

Figure 10:
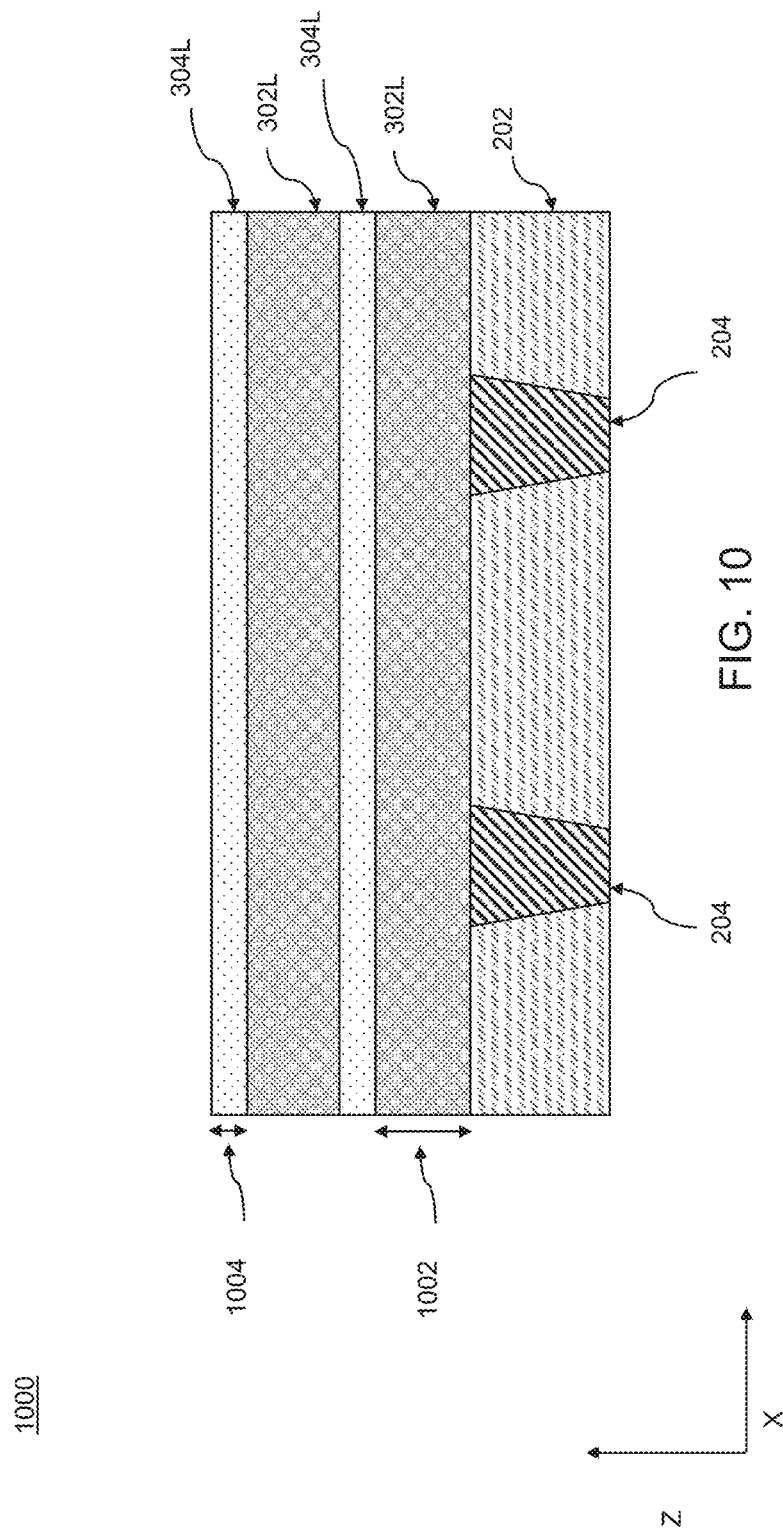
FIG. 10 is a vertical cross-sectional view of an intermediate structure that may be used in the formation of a capacitor structure, according to various other embodiments.

FIG. 10 is a vertical cross-sectional view of an intermediate structure 1000 that may be used in the formation of a capacitor structure, according to various other embodiments. As shown, the intermediate structure 1000 of FIG. 10 includes an alternating stack of dielectric layers including a first dielectric layer 302L and a second dielectric layer 304L. As such, the intermediate structure 1000 is similar to the intermediate structure 300 of FIG. 3. In contrast to the intermediate structure 300 of FIG. 3, however, the first dielectric layer 302L may have a first thickness 1002 while the second dielectric layer 304L may have a second thickness 1004. The intermediate structure 1000 of FIG. 10 may be further processed as described above with reference to FIGS. 4 to 9 to generate a capacitor structure similar to the capacitor structure 900 of FIG. 9.

Figure 11:
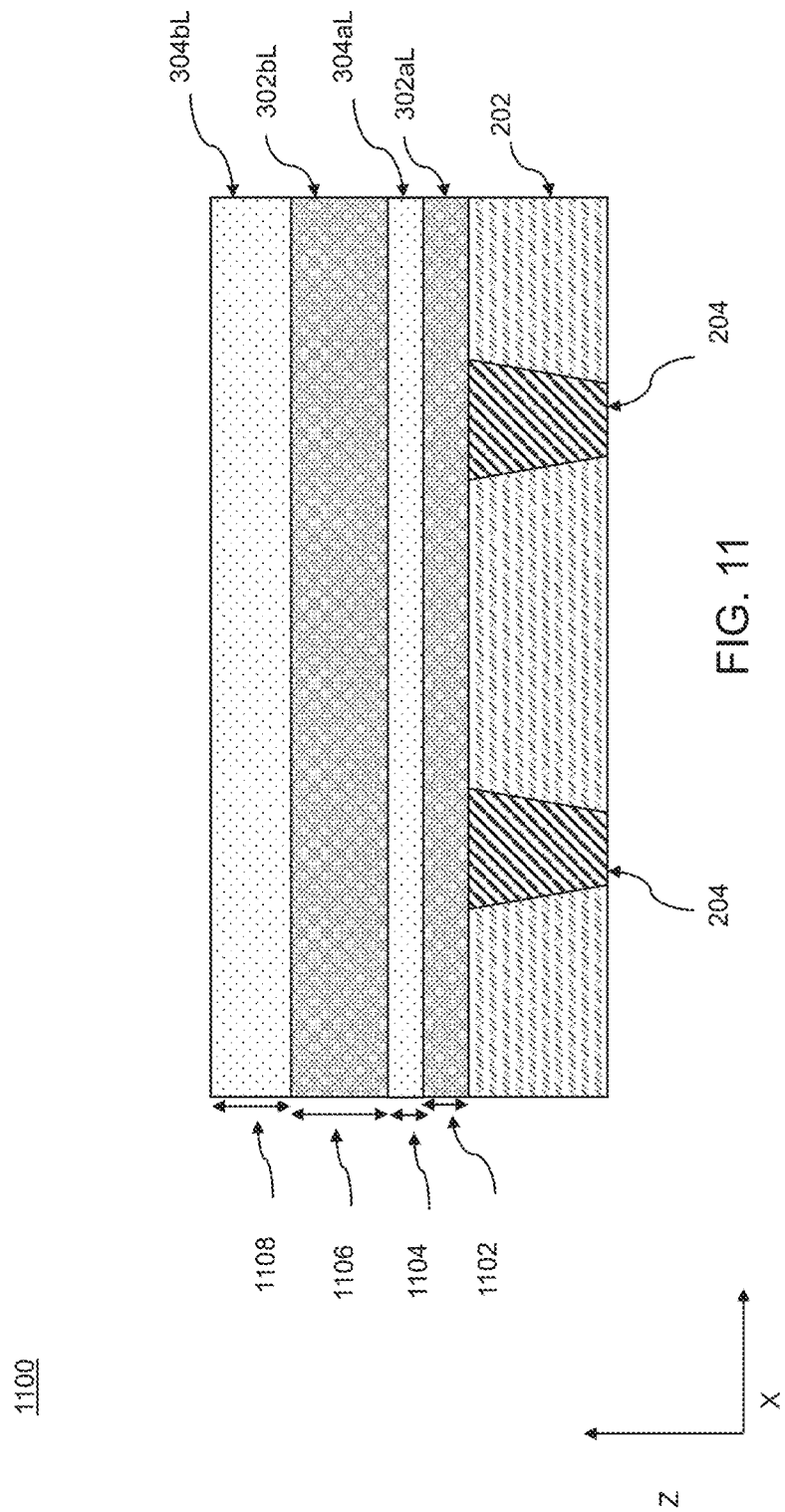
FIG. 11 is a vertical cross-sectional view of a further intermediate structure that may be used in the formation of a capacitor structure, according to various other embodiments.

FIG. 11 is a vertical cross-sectional view of a further intermediate structure 1100 that may be used in the formation of a capacitor structure, according to various other embodiments. As shown, the intermediate structure 1100 of FIG. 11 includes an alternating stack of dielectric layers including a first dielectric layer 302aL, a second dielectric layer 304aL, a third dielectric layer 302bL, and a fourth dielectric layer 304bL. Each of the first dielectric layer 302aL and the third dielectric layer 302bL may include a first dielectric material and each of the second dielectric layer 304aL and the fourth dielectric layer 304bL may include a second dielectric material. As such, the intermediate structure 1100 is similar to the intermediate structure 300 of FIG. 3.

In contrast to the intermediate structure 300 of FIG. 3, however, each of the first dielectric layer 302aL, the second dielectric layer 304aL, the third dielectric layer 302bL, and the fourth dielectric layer 304bL may have different respective thicknesses. In this regard, the first dielectric layer 302aL may have a first thickness 1102, the second dielectric layer 304aL may have a second thickness 1104, the third dielectric layer 302bL may have a third thickness 1106, and the fourth dielectric layer 304bL may have a fourth thickness 1108. The intermediate structure 1100 of FIG. 11 may be further processed as described above with reference to FIGS. 4 to 9 to generate a capacitor structure similar to the capacitor structure 900 of FIG. 9.

Figure 12:
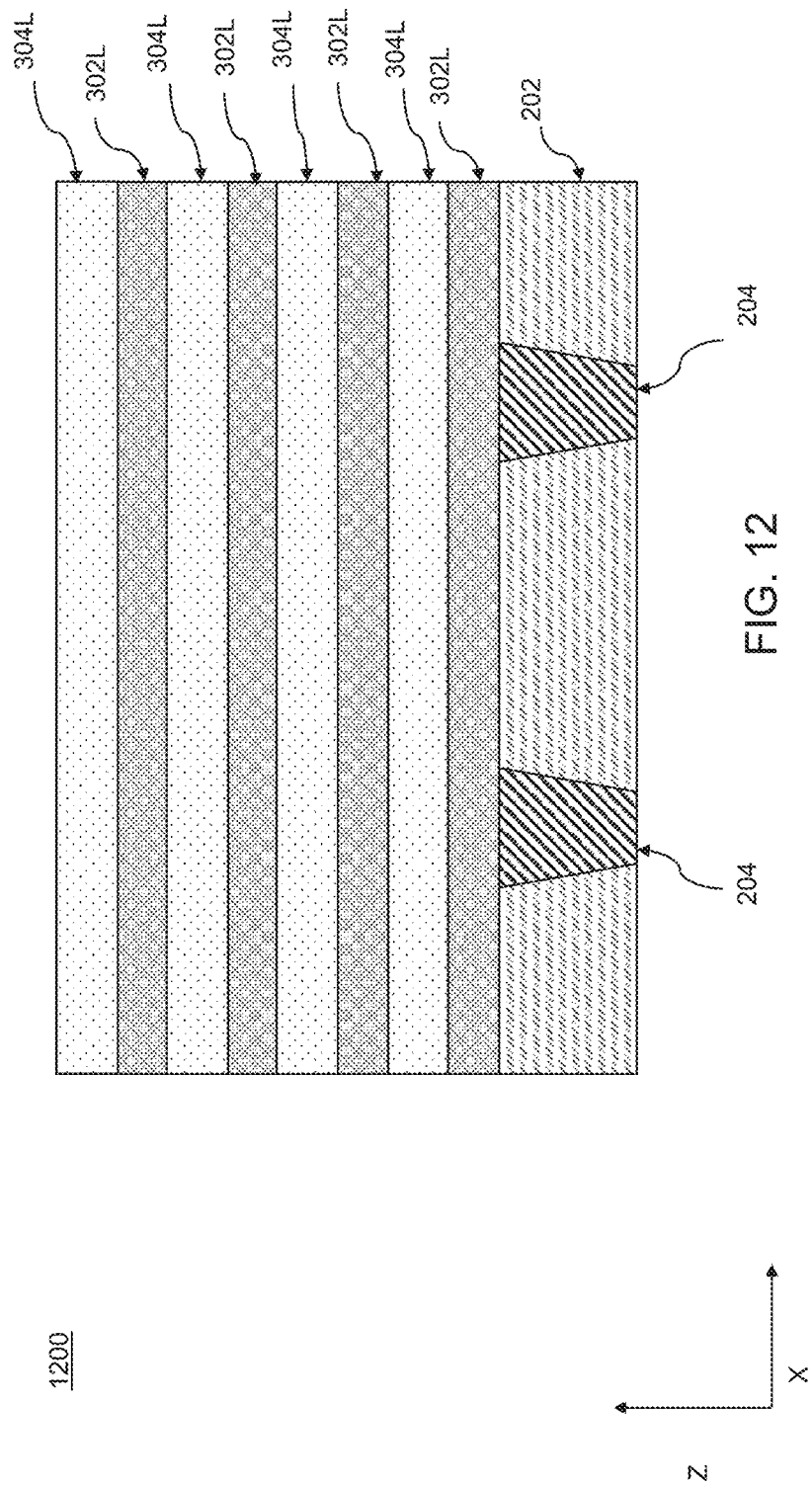
FIG. 12 is a vertical cross-sectional view of a further intermediate structure that may be used in the formation of a capacitor structure, according to various other embodiments.

FIG. 12 is a vertical cross-sectional view of a further intermediate structure 1200 that may be used in the formation of a capacitor structure, according to still various other embodiments. As shown, the intermediate structure 1200 of FIG. 12 includes an alternating stack of dielectric layers including a first dielectric layer 302L and a second dielectric layer 304L. As such, the intermediate structure 1200 is similar to the intermediate structure 300 of FIG. 3. In contrast to the intermediate structure 300 of FIG. 3, however, the intermediate structure 1200 of FIG. 12 may include additional layers. In this regard, the intermediate structure 1200 includes four pairs of layers, with each pair of layers including the first dielectric layer 302L and the second dielectric layer 304L, in contrast to the intermediate structure 300 of FIG. 3 that includes only two pairs of layers including the first dielectric layer 302L and the second dielectric layer 304L. Other embodiments may include various other numbers of dielectric layers in an alternating stack of dielectric materials. Further, additional embodiments may include layers having varying thicknesses and varying compositions. As such, intermediate structures of alternative embodiments need not be limited to including only the first dielectric layer 302L and the second dielectric layer 304L.

Figure 13:
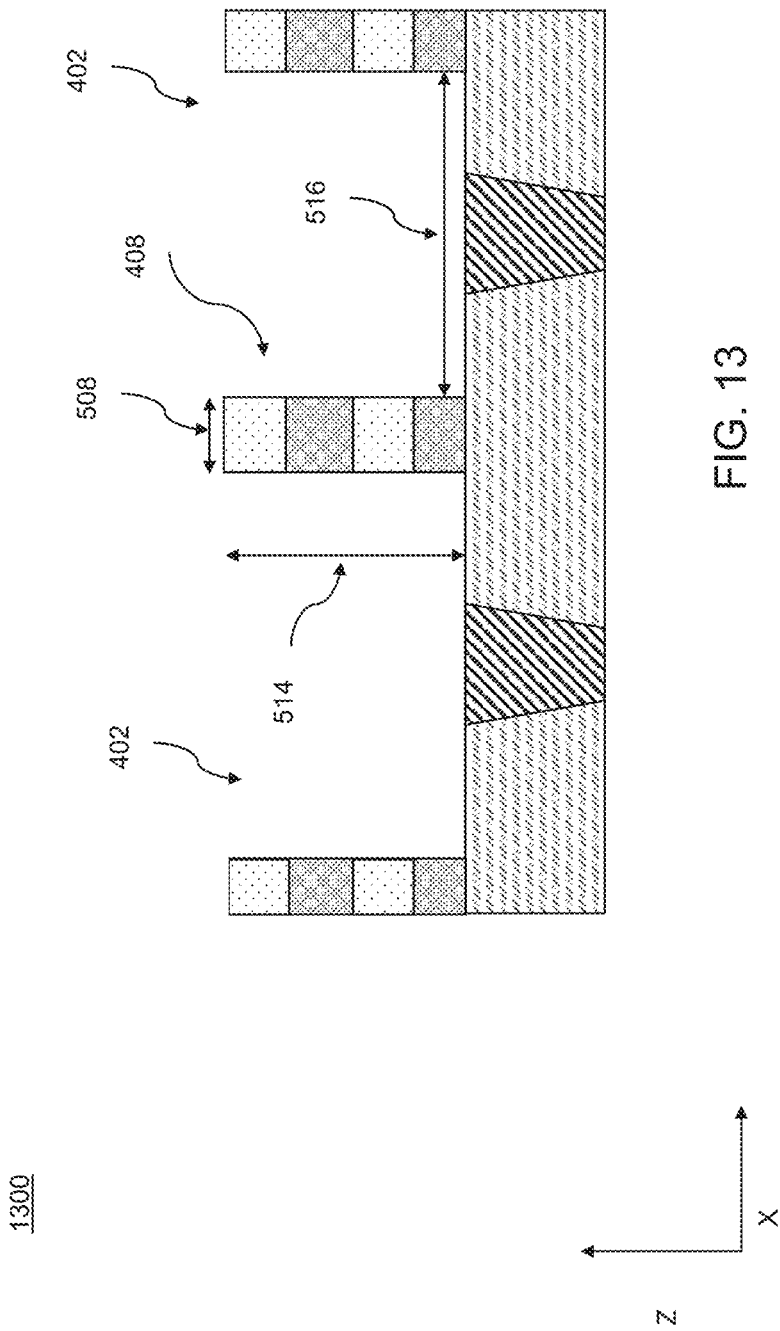
FIG. 13 is a vertical cross-sectional view of a further intermediate structure that may be used in the formation of a capacitor structure, according to various other embodiments.

FIG. 13 is a vertical cross-sectional view of a further intermediate structure 1300 that may be used in the formation of a capacitor structure, according to various embodiments. In this regard, the intermediate structure 1300 is similar to the intermediate structure 400 of FIG. 4. The intermediate structure 1300 of FIG. 13, however, has different values for the height 514 and width 516 of the trenches 402, and for the width 508 of remaining portions 408 of the alternating stack of dielectric layers after etching. As shown in FIG. 13, the width 516 of the trenches 402 may be greater than the height 514, in contrast to the intermediate structure 400 of FIG. 4, in which the height and width have similar values. Various other embodiments may include respective height and width relationships.

Figure 14:
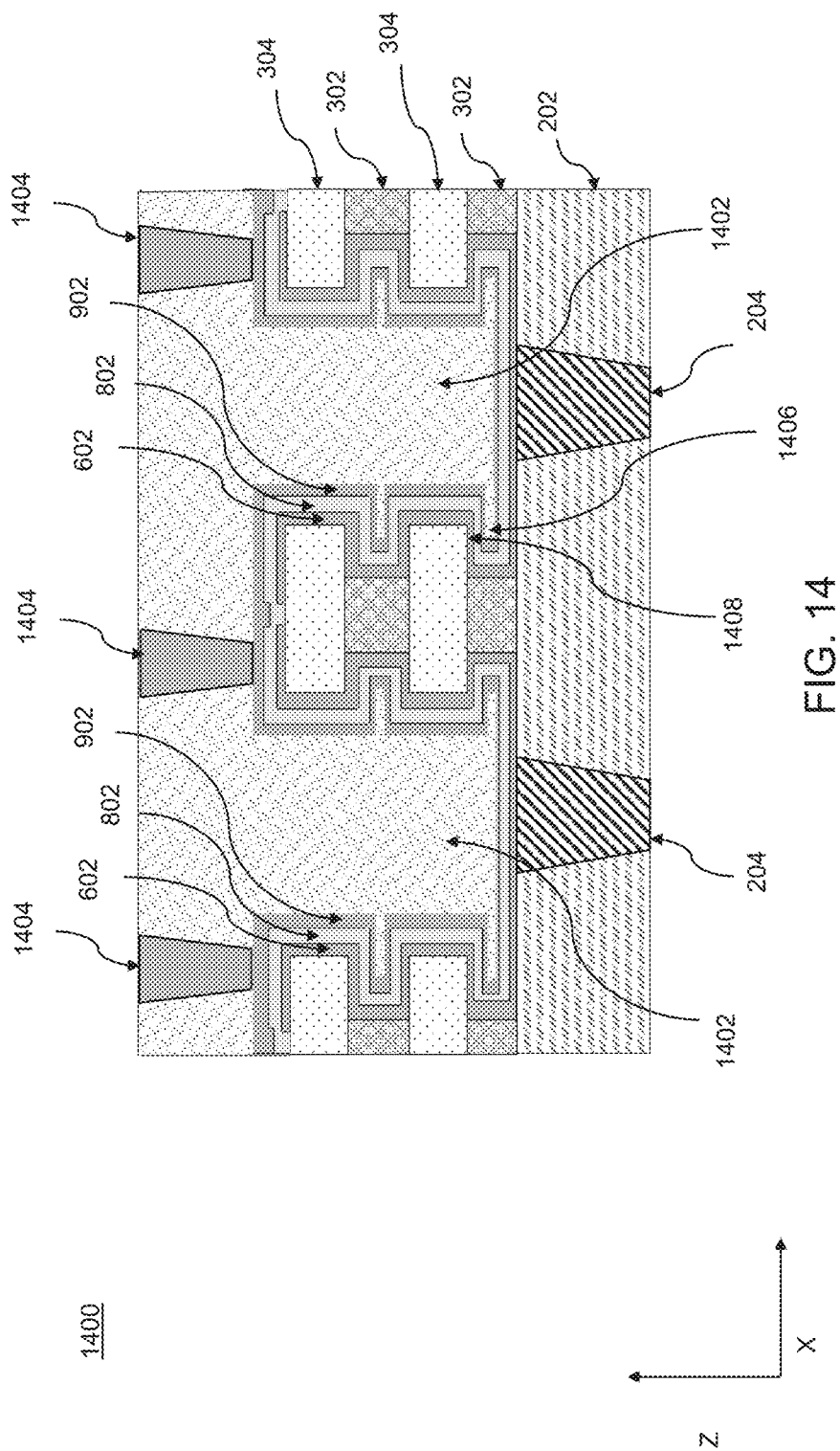
FIG. 14 is a vertical cross-sectional view of a capacitor structure, according to various other embodiments.

FIG. 14 is a vertical cross-sectional view of a further capacitor structure 1400, according to various embodiments. The capacitor structure 1400 may be fabricated using processes similar to those that may be used to fabricate the capacitor structure 900 of FIG. 9. Rather than filling the intermediate structure 800 of FIG. 8 with the conductive material to form the top electrode 902 of the capacitor structure 900 of FIG. 9, however, a top electrode 902 in the capacitor structure 1400 of FIG. 14 may be formed by depositing a thin layer of conductive material. A dielectric fill material 1402 may then be deposited over the top electrode 902 in the capacitor structure 1400 of FIG. 14. The dielectric fill material 1402 may be an oxide or a nitride. Various other dielectric fill materials 1402 may be used in other embodiments. As shown in FIG. 14, dielectric fill material 1402 may be deposited over the top electrode 902 such that a bottommost portion 1406 of the dielectric fill material 1402 is lower than a bottommost surface 1408 of the second dielectric layers 304. Via structures 1404 may then be formed in the dielectric fill material 1402. The via structures 1404 may be configured to make electrical contact with the top electrode 902.

Figure 15:
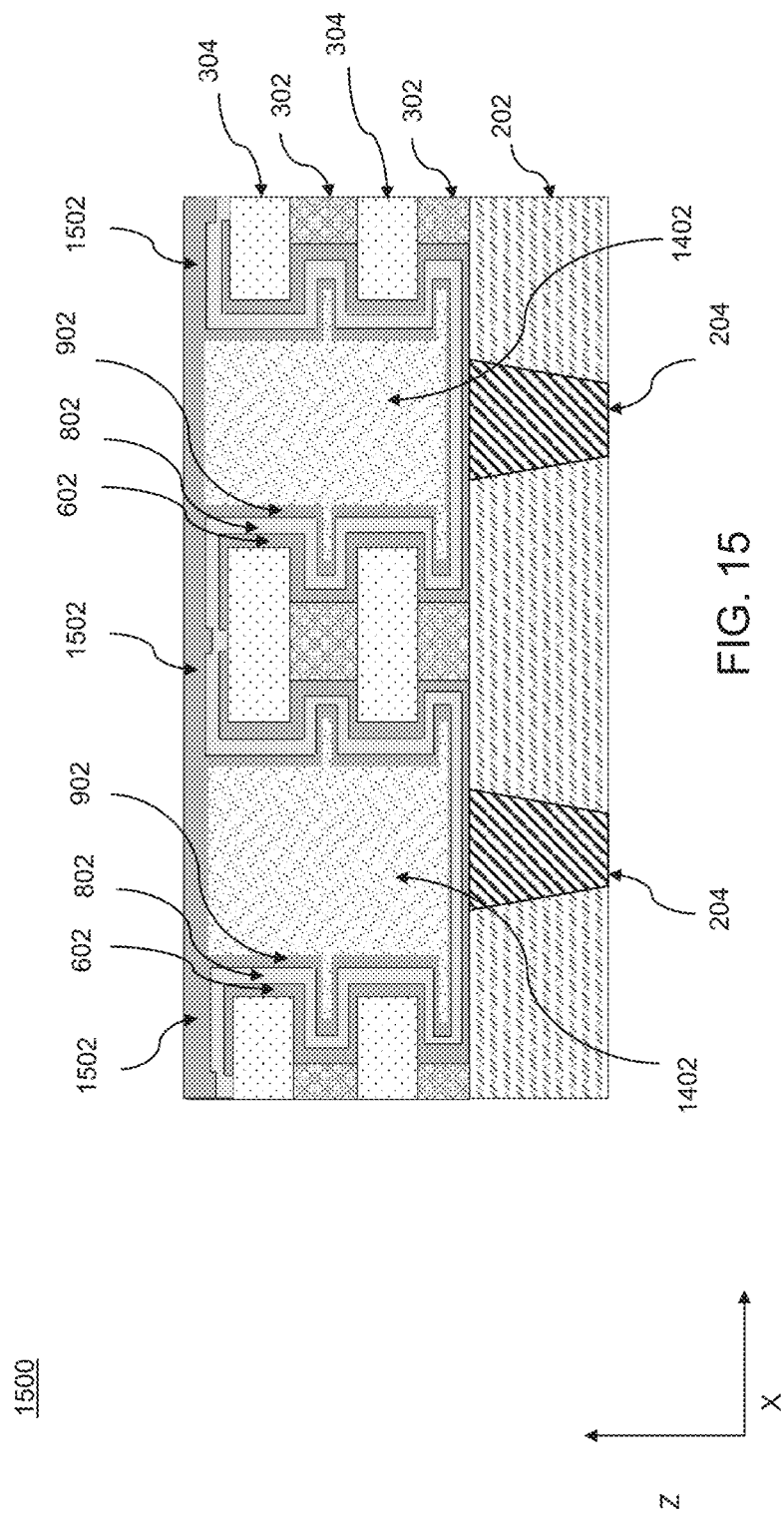
FIG. 15 is a vertical cross-sectional view of a further capacitor structure, according to various other embodiments.

FIG. 15 is a vertical cross-sectional view of a further capacitor structure 1500, according to various embodiments. The capacitor structure 1500 may be fabricated using processes similar to those that may be used to fabricate the capacitor structure 1400 of FIG. 14. Rather than forming via structures 1404 (e.g., see FIG. 14), however, the dielectric fill material 1402 may be planarized (e.g., by CMP) and then a top electrically conductive portion 1502 may be deposited over the planarized dielectric fill material 1402, as shown in FIG. 15. The top electrically conductive portion 1502 may be configured to make an electrically conductive connection with the top electrode 902.

Figure 16:
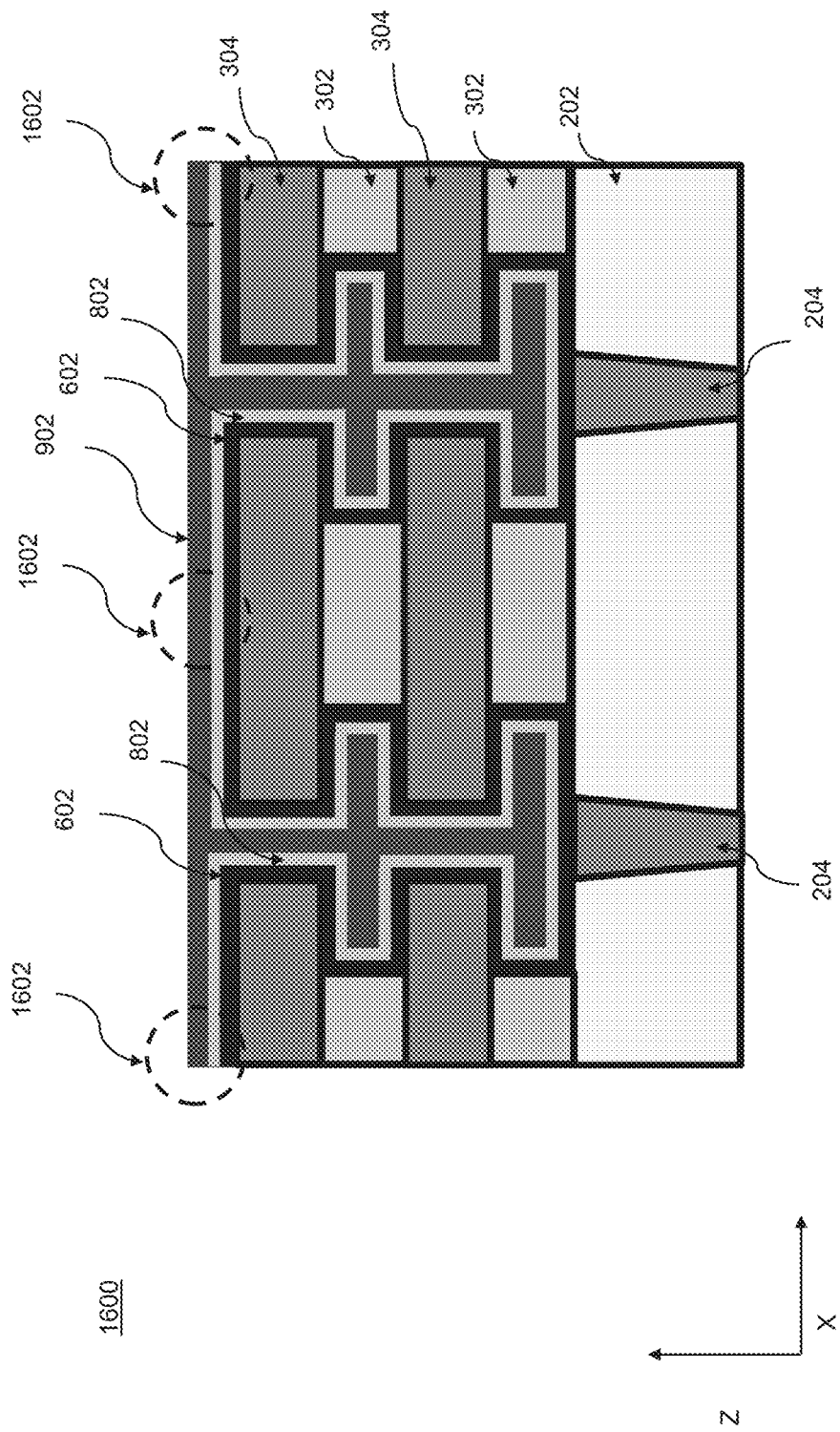
FIG. 16 is a vertical cross-sectional view of a further intermediate structure that may be used in the formation of a capacitor structure, according to various embodiments.

FIG. 16 is a vertical cross-sectional view of a further intermediate structure 1600 that may be used in the formation of a capacitor structure, according to various embodiments. The intermediate structure 1600 is similar to the capacitor structure 900 of FIG. 9. In this regard, the intermediate structure 1600 may be configured to function as a capacitor having a bottom electrode 602 and a top electrode 902 that are separated by a first high-k dielectric layer 802. However, in this embodiment, the intermediate structure 1600 may be further processed to remove the support structure (i.e., the first dielectric layer 302 and the second dielectric layer 304), to add an additional high-k dielectric layer, and to add an additional layer of a conductive material to form a top electrode, as described in greater detail with reference to FIGS. 17 to 23, below.

Figure 17:
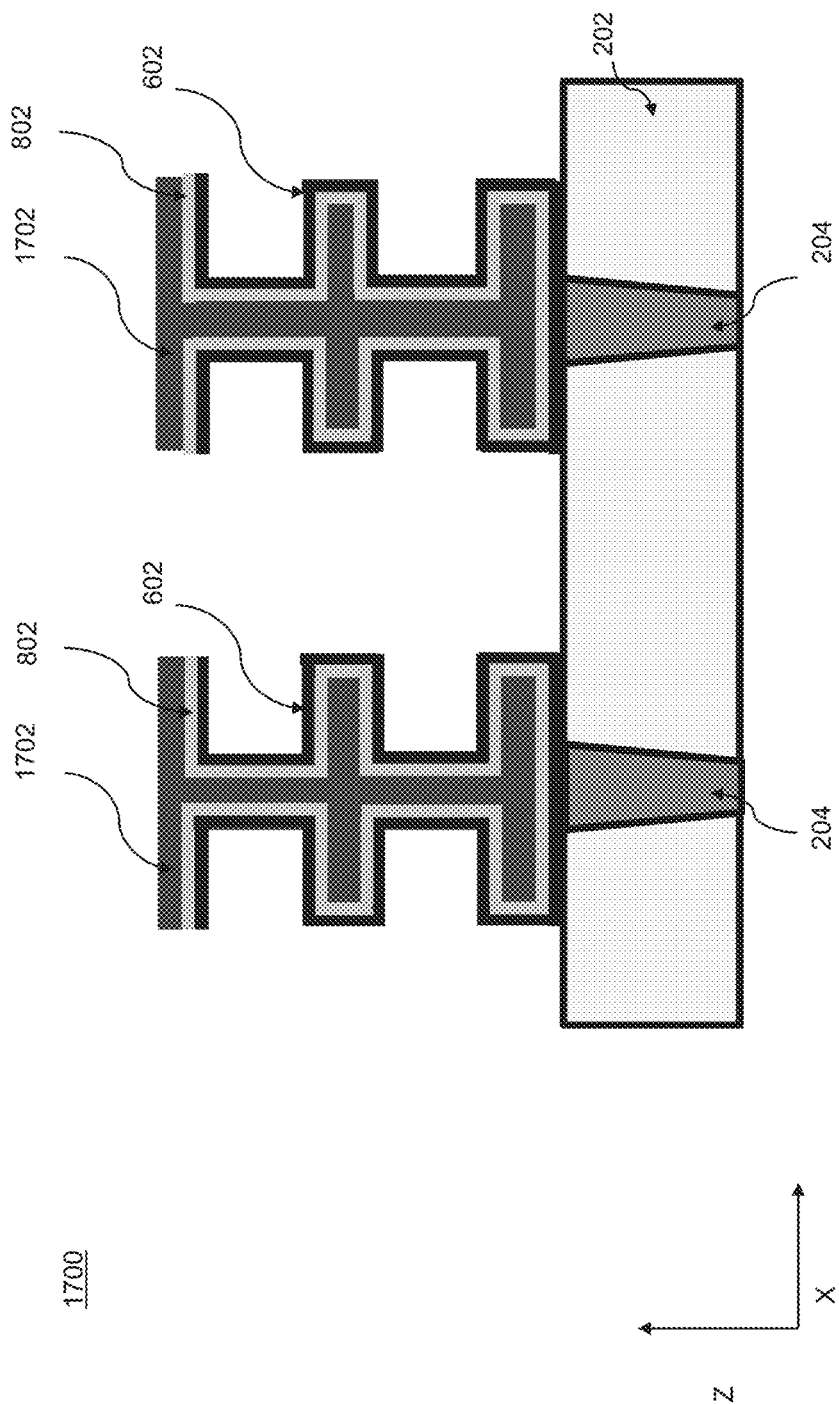
FIG. 17 is a vertical cross-sectional view of a further intermediate structure that may be used in the formation of a capacitor structure, according to various embodiments.

FIG. 17 is a vertical cross-sectional view of a further intermediate structure 1700 that may be used in the formation of a capacitor structure, according to various embodiments. The intermediate structure 1700 may be formed by removing the support structure (i.e., the first dielectric layer 302 and the second dielectric layer 304) from the intermediate structure 1600 of FIG. 16. In this regard, portions 1602 of the bottom electrode 602, the first high-k dielectric layer 802, and the top electrode 902 (e.g., see FIG. 16) may be removed to thereby expose a top portion of the second dielectric layer 304. Removal of portions of the top electrode 902 causes the top electrode 902 to be separated into a plurality of disconnected conductors 1702, as shown in FIG. 17.

A patterned photoresist (not shown) may be formed over the intermediate structure 1600 of FIG. 16 by depositing a photoresist and patterning the photoresist using photolithographic techniques. The patterned photoresist may then be used to etch the portions 1602 of the bottom electrode 602, the first high-k dielectric layer 802, and the top electrode 902 to expose the second dielectric layer 304. A wet chemical etch may then be performed to remove the second dielectric layer 304 and the first dielectric layer selective to the bottom electrode 602. According to an embodiment, a solution of HF may be used to perform the wet etching process. Alternative embodiments may use other suitable etchants.

Figure 18:
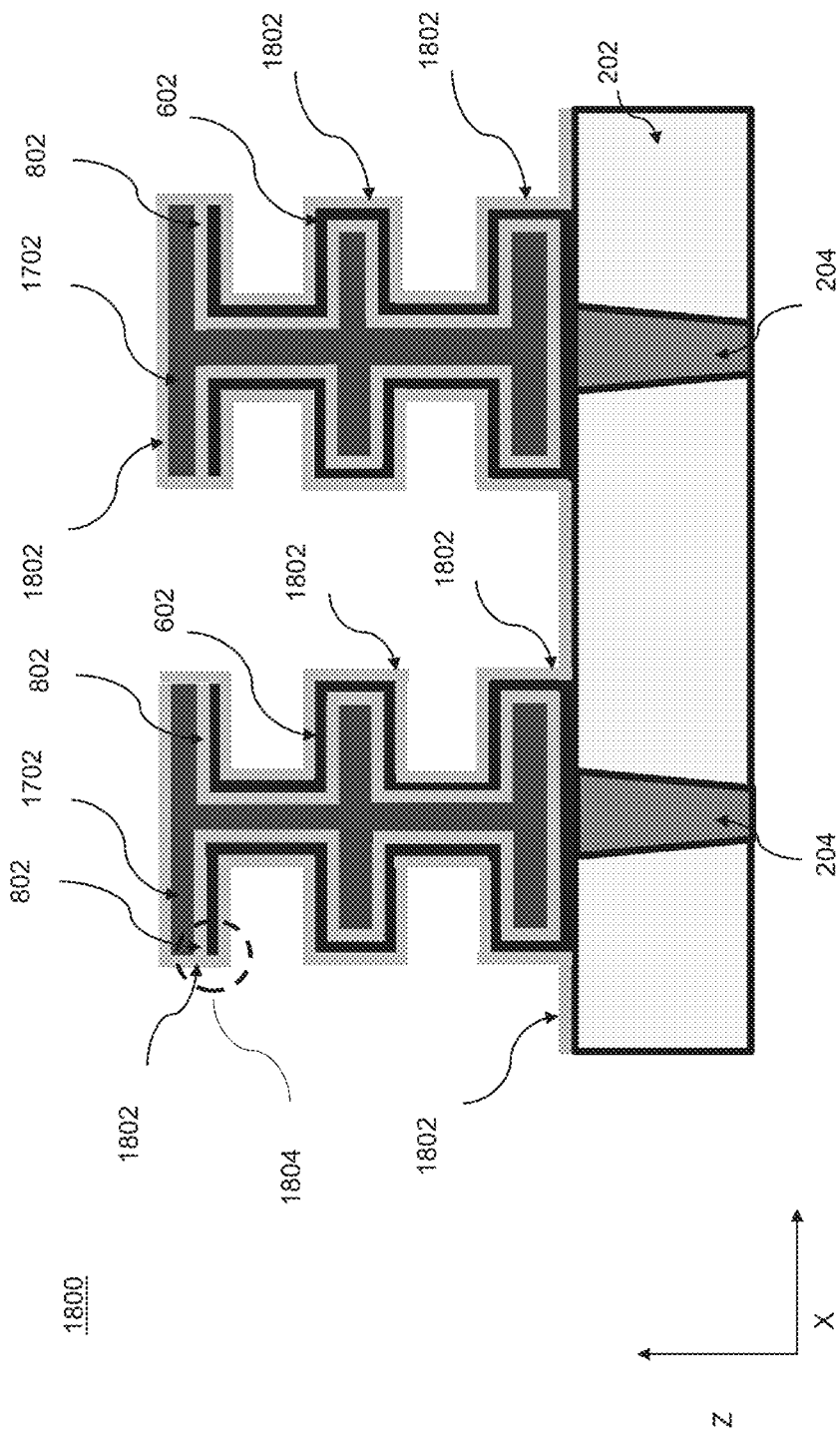
FIG. 18 is a vertical cross-sectional view of a further intermediate structure that may be used in the formation of a capacitor structure, according to various embodiments.

FIG. 18 is a vertical cross-sectional view of a further intermediate structure 1800 that may be used in the formation of a capacitor structure, according to various embodiments. The intermediate structure 1800 may be formed by deposition of a second high-k dielectric layer 1802 over the intermediate structure 1700 of FIG. 17. According to an embodiment, the second high-k dielectric layer 1802 may be conformally deposited and may include a high-k dielectric material including, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, and hafnium dioxide-alumina ($HfO_2$—$Al_2O_3$). Other suitable dielectric materials are within the contemplated scope of disclosure. In various embodiments, the second high-k dielectric layer 802 may have a thickness that may be in a range from approximately 3 nm to approximately 10 nm. Other embodiments may include a high-k dielectric having a larger or smaller thicknesses. The first high-k dielectric layer 802 and the second high-k dielectric layer 1802 may be the same material or may be different materials.

As shown in FIG. 18, deposition of the second high-k dielectric layer 1802 causes an interface 1804 to form between the first high-k dielectric layer 802 and the second high-k dielectric layer 1802. The interface 1804 may be imaged using transmission electron microscopy (TEM) along with energy dispersive x-ray analysis (EDX). The interface 1804 between the first high-k dielectric layer 802 and the second high-k dielectric layer 1802 may be configured to prevent a conductive electrical contact between the bottom electrode 602 and the disconnected conductor 1702. As such, the first high-k dielectric layer 802 and the second high-k dielectric layer 1802 effectively form a uniform dielectric layer that is formed on opposite sidewalls of the first electrode 602.

Figure 19:
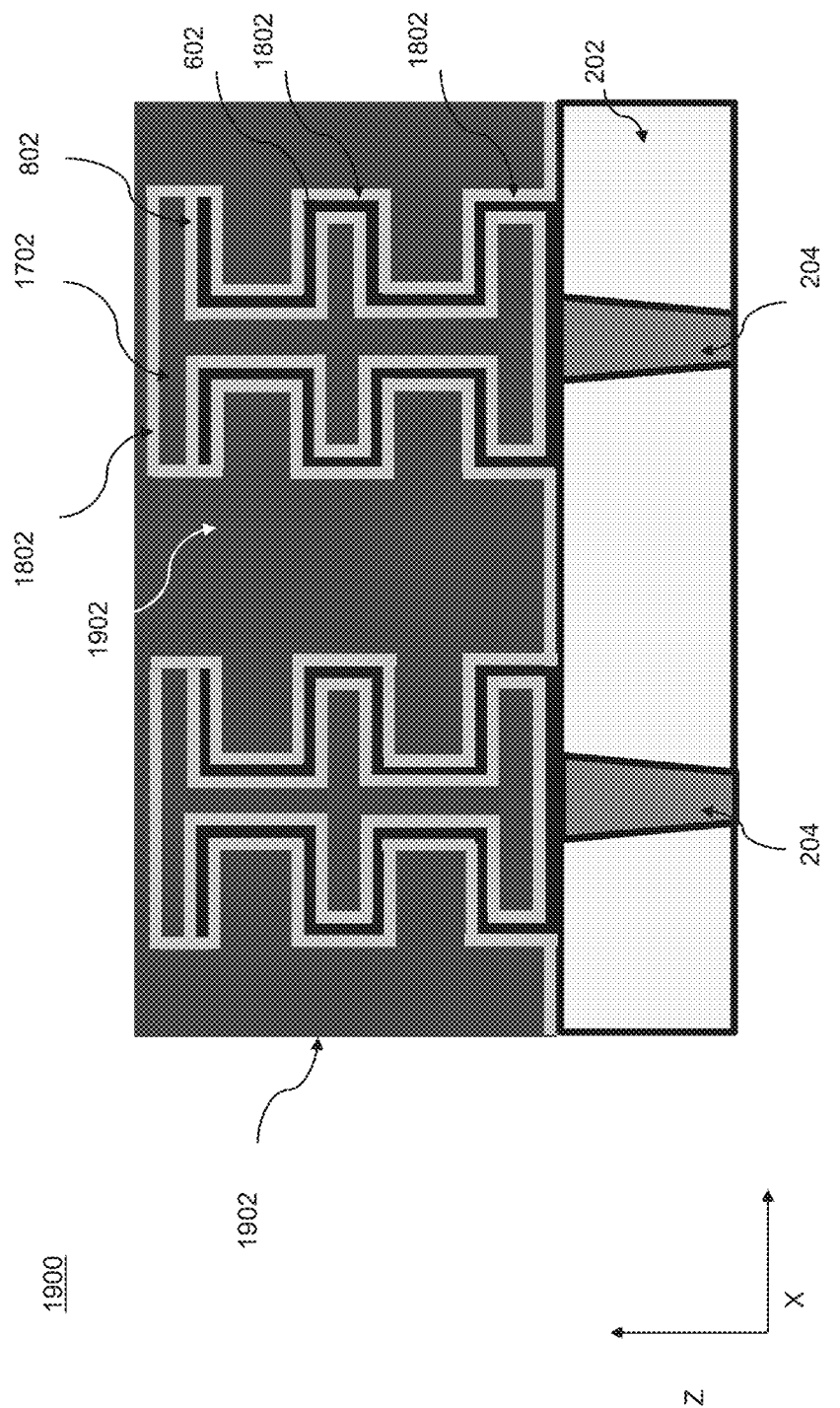
FIG. 19 is a vertical cross-sectional view of a capacitor structure, according to various embodiments.

FIG. 19 is a vertical cross-sectional view of a capacitor structure 1900, according to various embodiments. The capacitor structure 1900 may be formed by deposition of a conductive material to form a top electrode 1902 over the intermediate structure 1800 of FIG. 18. The top electrode 1902 may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable conductive materials within the contemplated scope of this disclosure may also be used.

As shown in FIG. 19, the capacitor structure 1900 includes a bottom electrode 602, a disconnected conductor 1702, a first high-k dielectric layer 802 separating the bottom electrode 602 from the disconnected conductor 1702, a top electrode 1902, and a second high-k dielectric layer 1802 separating the bottom electrode 602 from the top electrode 1902. The capacitor structure 1900 may have increased capacitance relative to the capacitor structure 900 of FIG. 9 due to the absence of the support structure, the second high-k dielectric layer 1802, and the top electrode 1902 having a conducting material that occupies a portion of the volume previously occupied by the support structure.

Figure 20:
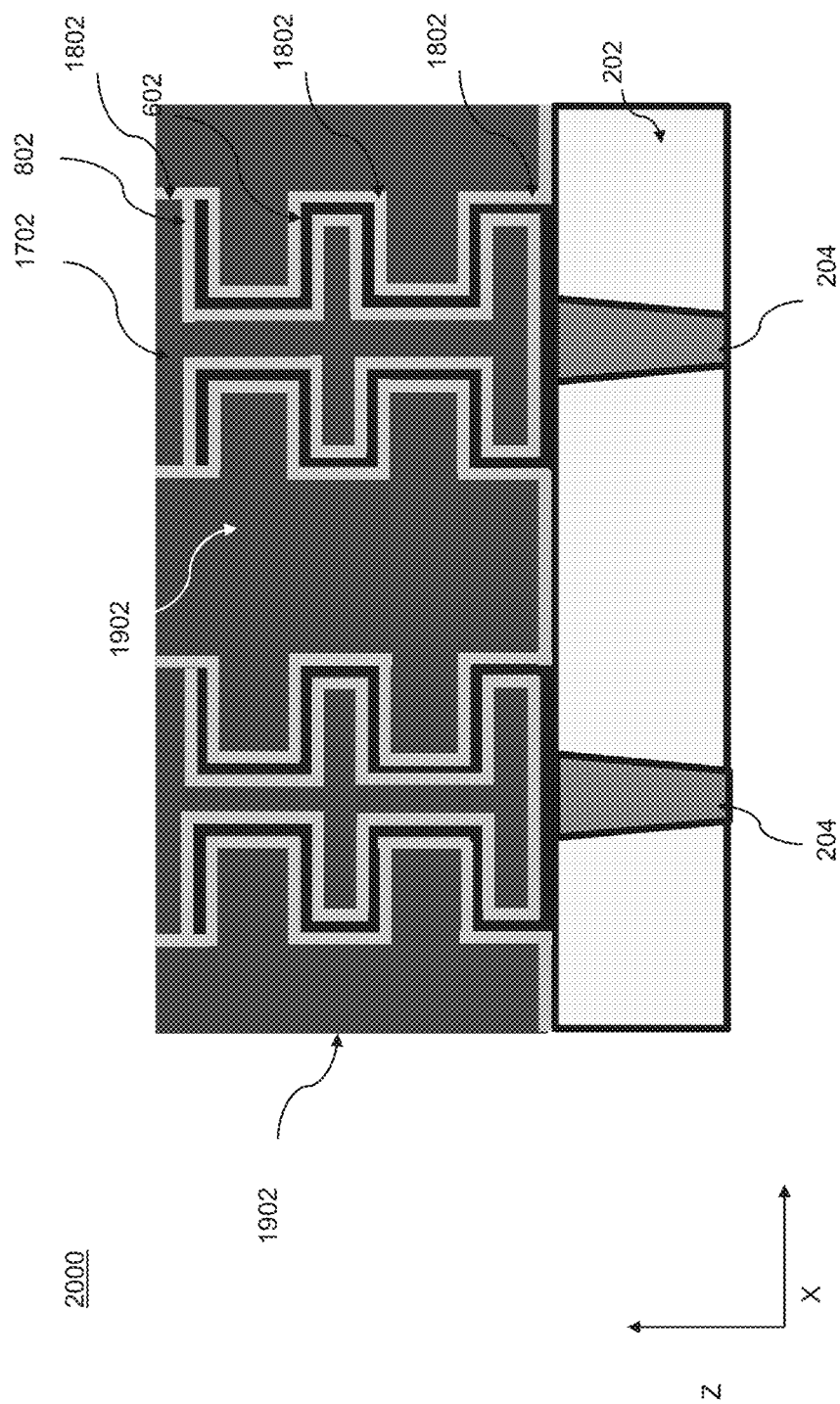
FIG. 20 is a vertical cross-sectional view of a further intermediate structure that may be used in the formation of a capacitor structure, according to various embodiments.
Figure 21:
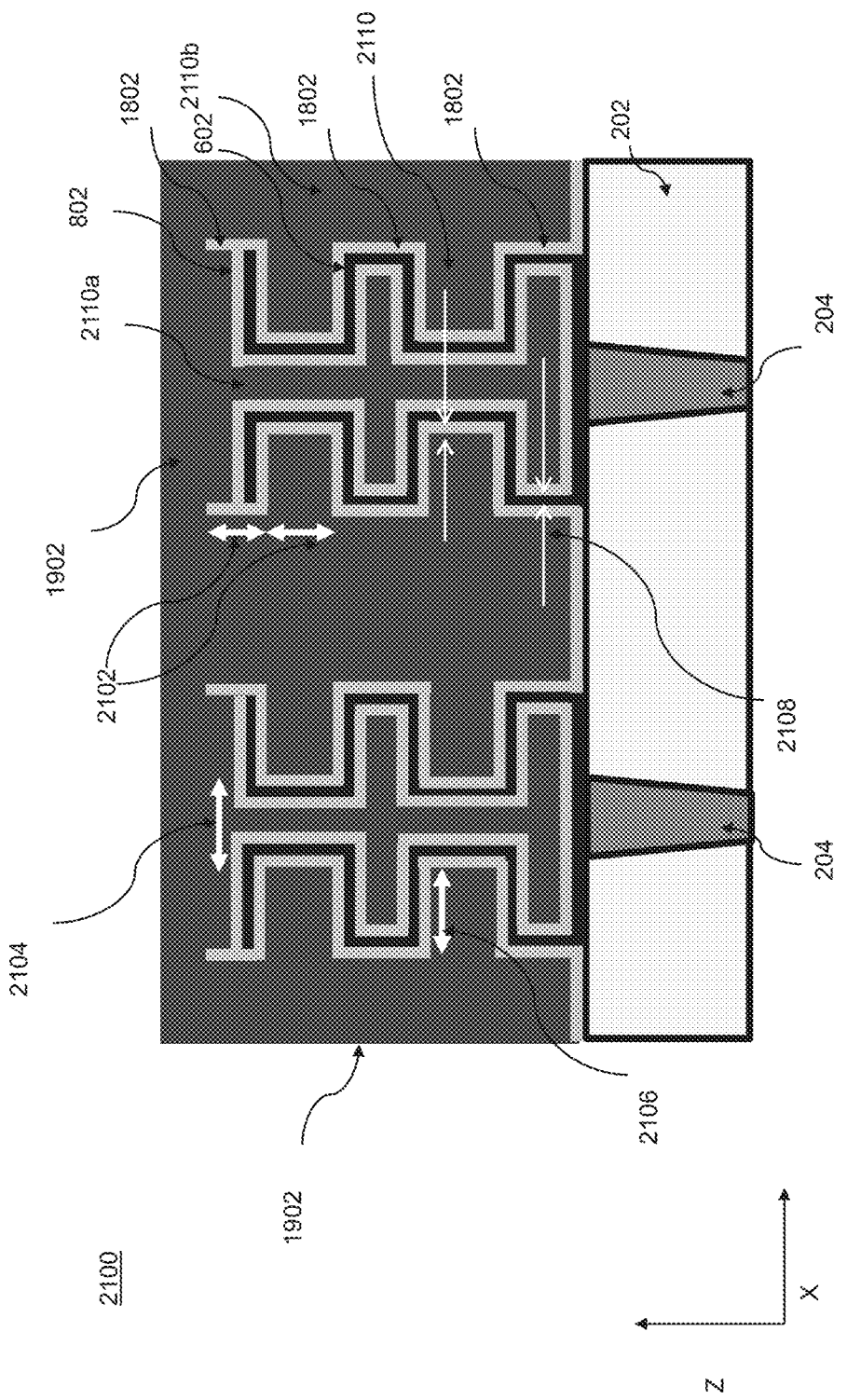
FIG. 21 is a vertical cross-sectional view of a capacitor structure, according to various embodiments.

FIG. 20 is a vertical cross-sectional view of a further intermediate structure 2000 that may be used in the formation of a capacitor structure, and FIG. 21 is a vertical cross-sectional view of a further capacitor structure 2100, according to various embodiments. The intermediate structure 2000 may be formed by planarizing the capacitor structure 1900 of FIG. 19. In this regard, a planarization process (e.g., CMP) may be performed to remove a portion of the top electrode 1902 and a top portion of the second high-k dielectric layer 1802 to thereby expose a top portion of the disconnected conductor 1702, as shown. The capacitor structure 2100 is then formed by deposition of an additional conductive material to thereby electrically connect the previously disconnected conductor 1702 such that this structure becomes part of, and electrically connected to, the top electrode 1902. As such, the top electrode 1902 includes a first portion 2110a and a second portion 2110b such that a portion of the first electrode 602 is located between the first portion 2110a of the second electrode and the second portion 2110b of the second electrode 1902. One or more interconnect structures may then be formed over the top electrode 1902 to thereby connect the top electrode 1902 to other circuit components such as a ground element.

In an example embodiment, the capacitor structure 2100 of FIG. 21 may include a thickness of stacked layers 2102 that is approximately 20 nm, a trench width 2104 that is approximately 20 nm, and an etch depth 2106 that is approximately 15 nm. The bottom electrode may have a thickness 2108 that is in a range from approximately 3 nm to approximately 10 nm, and a thickness of the first dielectric layer 802 and the second dielectric layer 1802 may each be a in a range from approximately 3 nm to approximately 10 nm. Other thicknesses may be used in other embodiments. The capacitance of the capacitor structure 2100 may be tuned by adjusting various parameters such as the thickness of stacked layers 2102, the trench width 2104, the etch depth 2106, a number of stacked layers, etc.

Figure 22:
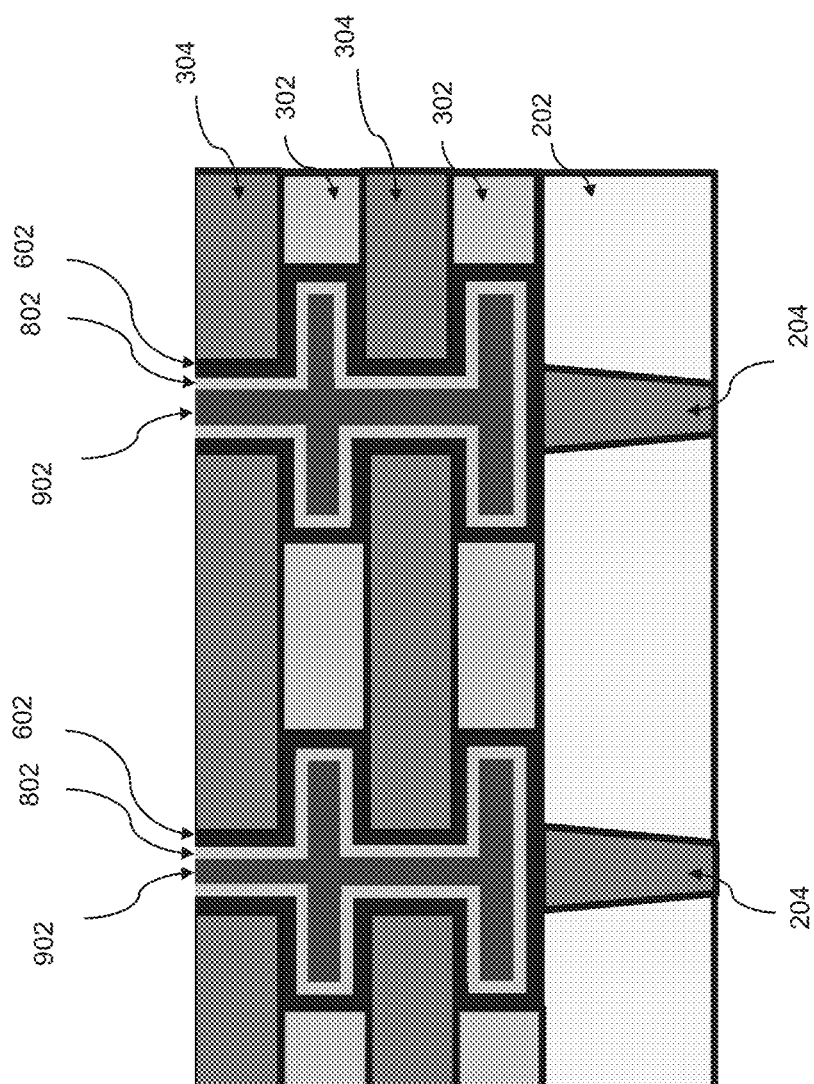
FIG. 22 is a vertical cross-sectional view of a further intermediate structure that may be used in the formation of a capacitor structure, according to various embodiments.
Figure 23:
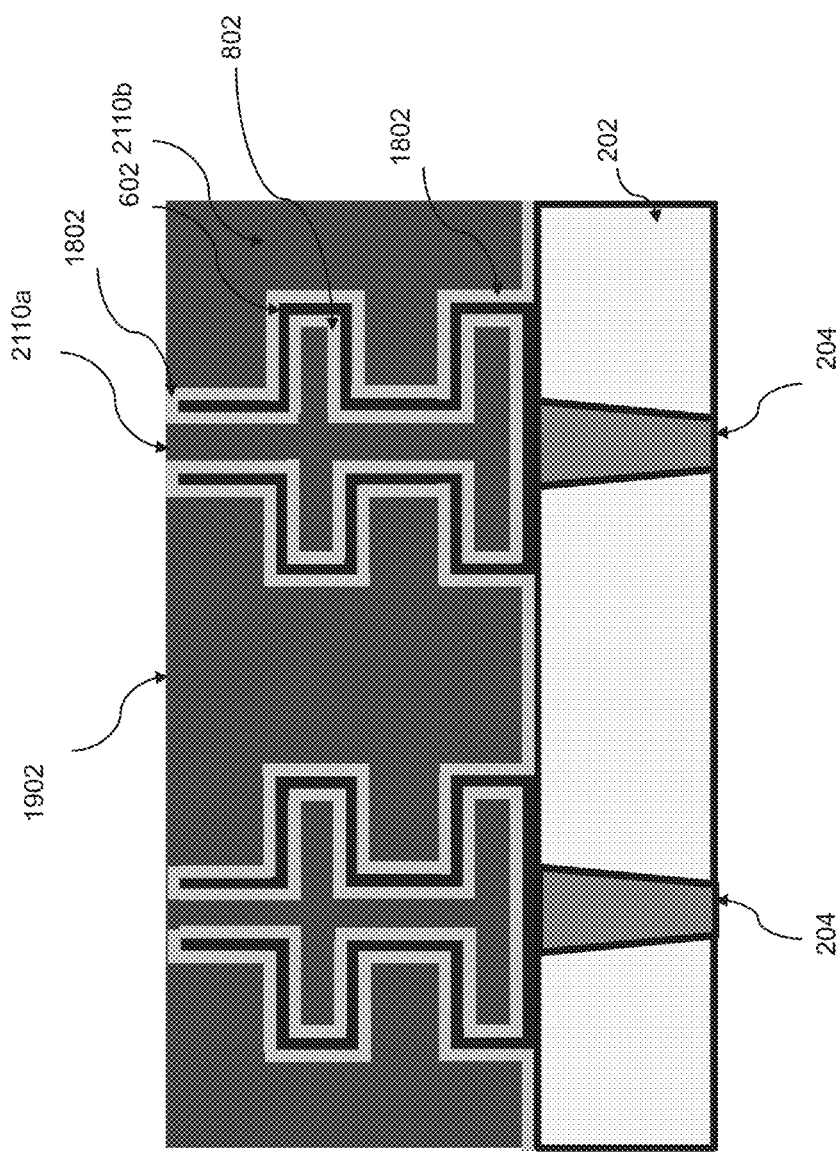
FIG. 23 is a vertical cross-sectional view of a capacitor structure, according to various embodiments.

FIG. 22 is a vertical cross-sectional view of a further intermediate structure 2200 that may be used in the formation of a capacitor structure, and FIG. 23 is a vertical cross-sectional view of a capacitor structure 2300, according to various embodiments. The intermediate structure 2200 may be formed by planarizing the intermediate structure 1600 of FIG. 16 to thereby remove the top layers of the bottom electrode 602, the first high-k dielectric layer 802, and the top electrode 902. The support structure (i.e., the first dielectric layer 302 and the second dielectric layer 304) may then be remove as described above with reference to FIGS. 16 and 17. A second high-k dielectric layer 1802 may then be formed, as describe above with reference to FIG. 18, and a top electrode 1902 may be formed, as described above with reference to FIG. 19. In certain embodiments, the capacitor structure 2300 of FIG. 23 may have greater mechanical stability without the uppermost structure of the embodiments of FIGS. 19 and 21. For example, potential film bending issues associated the embodiments of FIGS. 19 and 21 may be avoided by the capacitor structure 2300 of FIG. 23.

Figure 24:
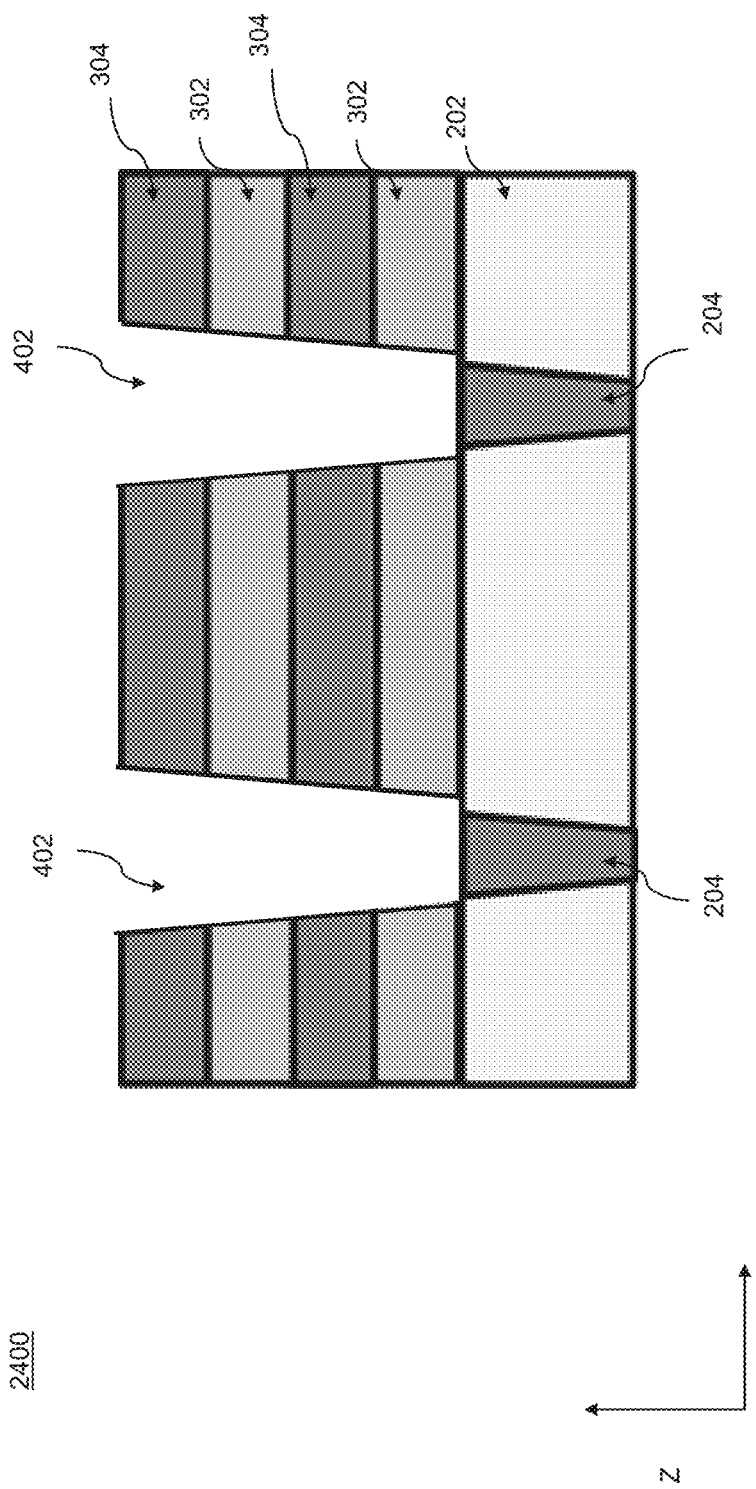
FIG. 24 is a vertical cross-sectional view of a further intermediate structure that may be used in the formation of a capacitor structure, according to various embodiments.
Figure 25:
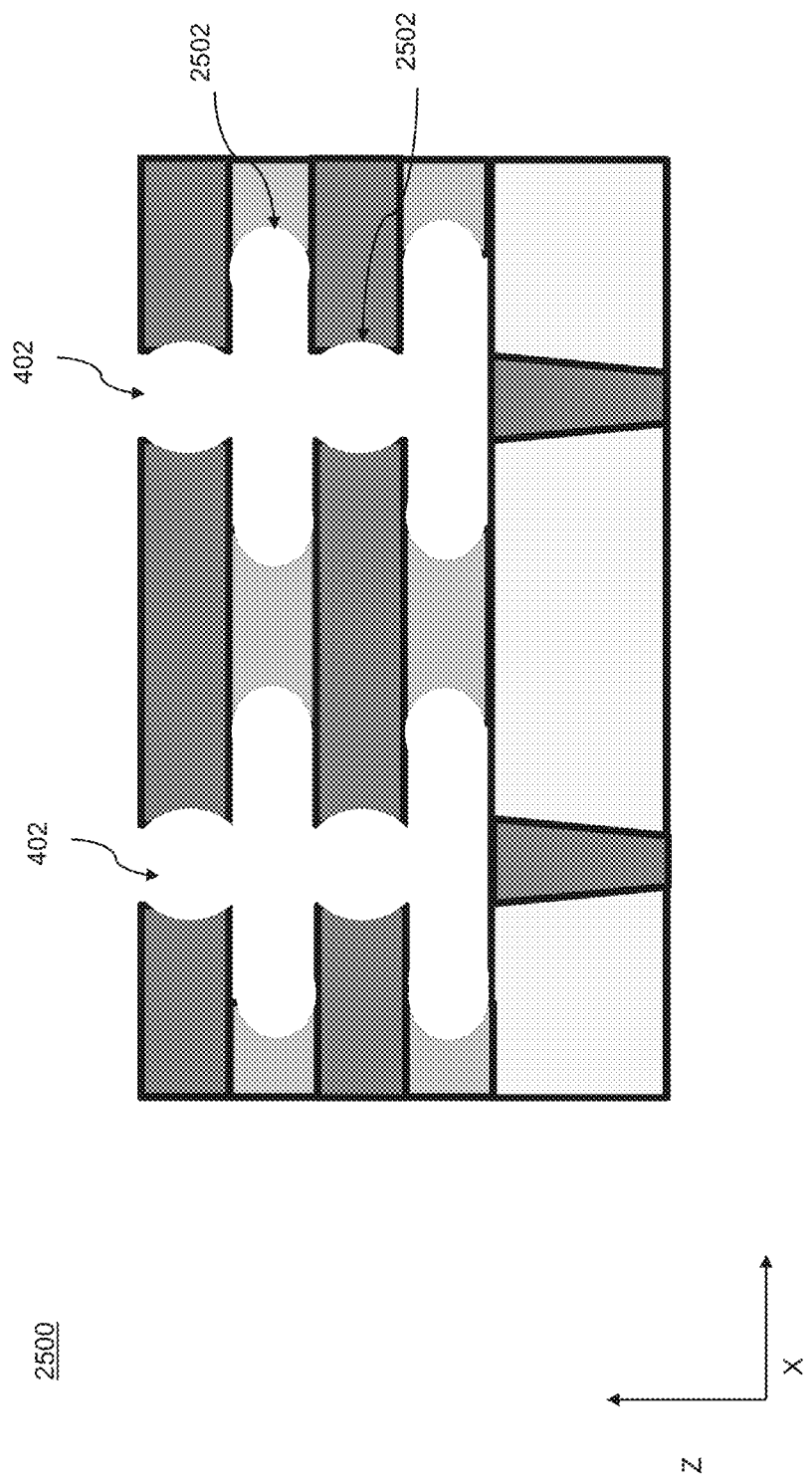
FIG. 25 is a vertical cross-sectional view of a further intermediate structure that may be used in the formation of a capacitor structure, according to various embodiments.

FIGS. 24 and 25 are vertical cross-sectional views of further intermediate structures 2400 and 2500, respectively, which may be used in the formation of capacitor structures, according to various embodiments. Intermediate structures 2400 and 2500 may each be formed by etching trenches 402 in an intermediate structure similar to the intermediate structure 300 of FIG. 3. In this regard, the intermediate structure 2400 includes trenches 402 having inclined sidewalls and the intermediate structure 2500 includes curved sidewalls 2502. The curved sidewalls 2502 of intermediate structure 2500 may be formed by performing an isotropic etch. Each of the intermediate structures 2400 and 2500 may be further processed to form a bottom electrode, a high-k dielectric layer, and a top electrode, as described above in various embodiments (e.g., see FIGS. 4 to 9 and 13 to 23 and related description, above).

Figure 26:
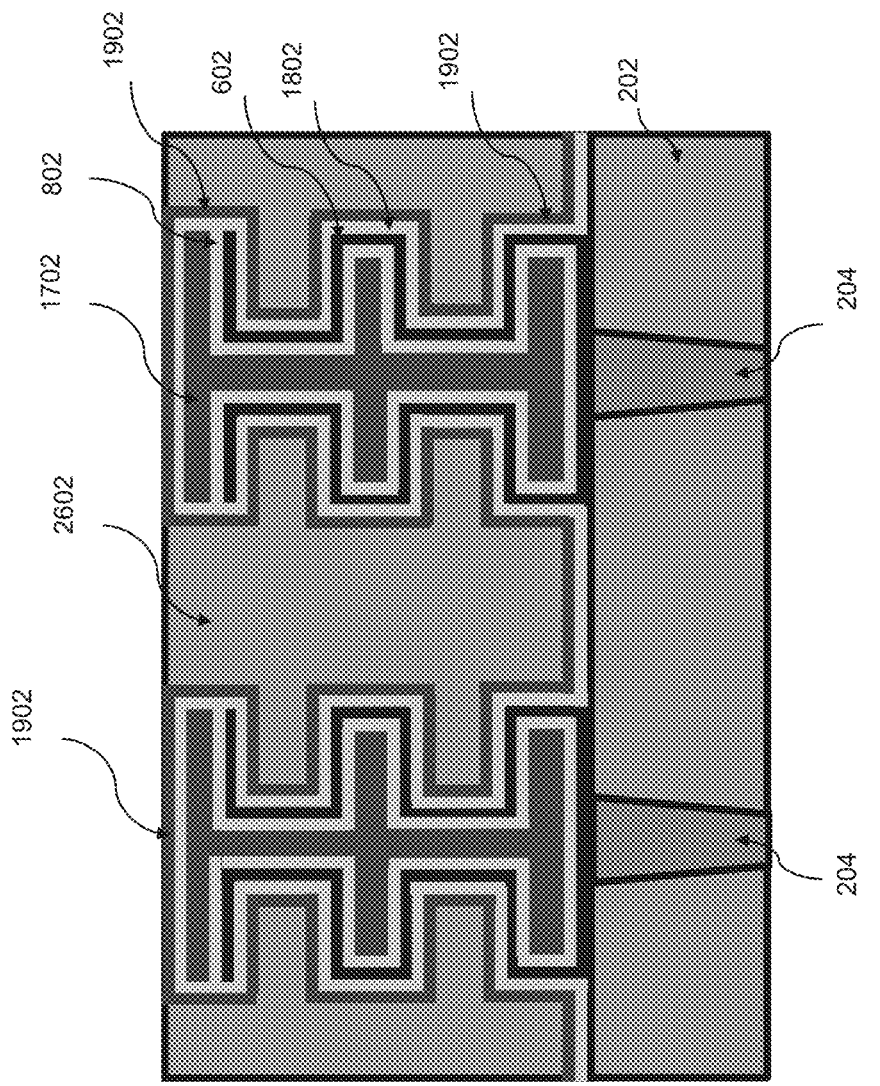
FIG. 26 is a vertical cross-sectional view of a further capacitor structure, according to various embodiments.

FIG. 26 is a vertical cross-sectional view of a further capacitor structure 2600, according to various embodiments. The capacitor structure 2600 may be formed from the intermediate structure 1800 of FIG. 18. In this regard, a top electrode 1902 may be formed over the intermediate structure 1800 of FIG. 18 followed by formation of a dielectric material 2602 over the top electrode 1902. In contrast to the capacitor structure 1900 of FIG. 19, however, the top electrode 1902 may be formed as a thin film having a thickness comparable to that of the bottom electrode 602 (e.g., in a range from approximately 3 nm to approximately 10 nm).

According to an embodiment, the dielectric material 2602 may be an oxide. Further, the dielectric material 2602 may be the same material that is used for the substrate 202. In certain embodiments, it may be easier to deposit the dielectric material 2602 than to deposit a volume of conducting material to form the top electrode 1902 of the capacitor structure 1900 of FIG. 19. As such, the capacitor structure 2600 may be less susceptible to the formation of voids within the dielectric material 2602 relative to a comparable volume of conducting material such as the top electrode 1902 in the capacitor structure 1900 of FIG. 19. In certain embodiments, the top electrode 1902 may be patterned to form one or more gaps (e.g., see gaps 702 in the intermediate structure 700 of FIG. 7) to thereby form separate capacitor structures.

All of the above-described embodiments are exemplary and many further embodiments may be generated by varying the materials and dimensions of the components of the above-described embodiments. For example, materials and thicknesses of the bottom electrode, the top electrode, the dielectric layers may be varied. Further, a given embodiment may be varied by adding one or more conductive layers, dielectric layers, etc. All such variations are contemplated as within the scope of the disclosed embodiments.

Figure 27:
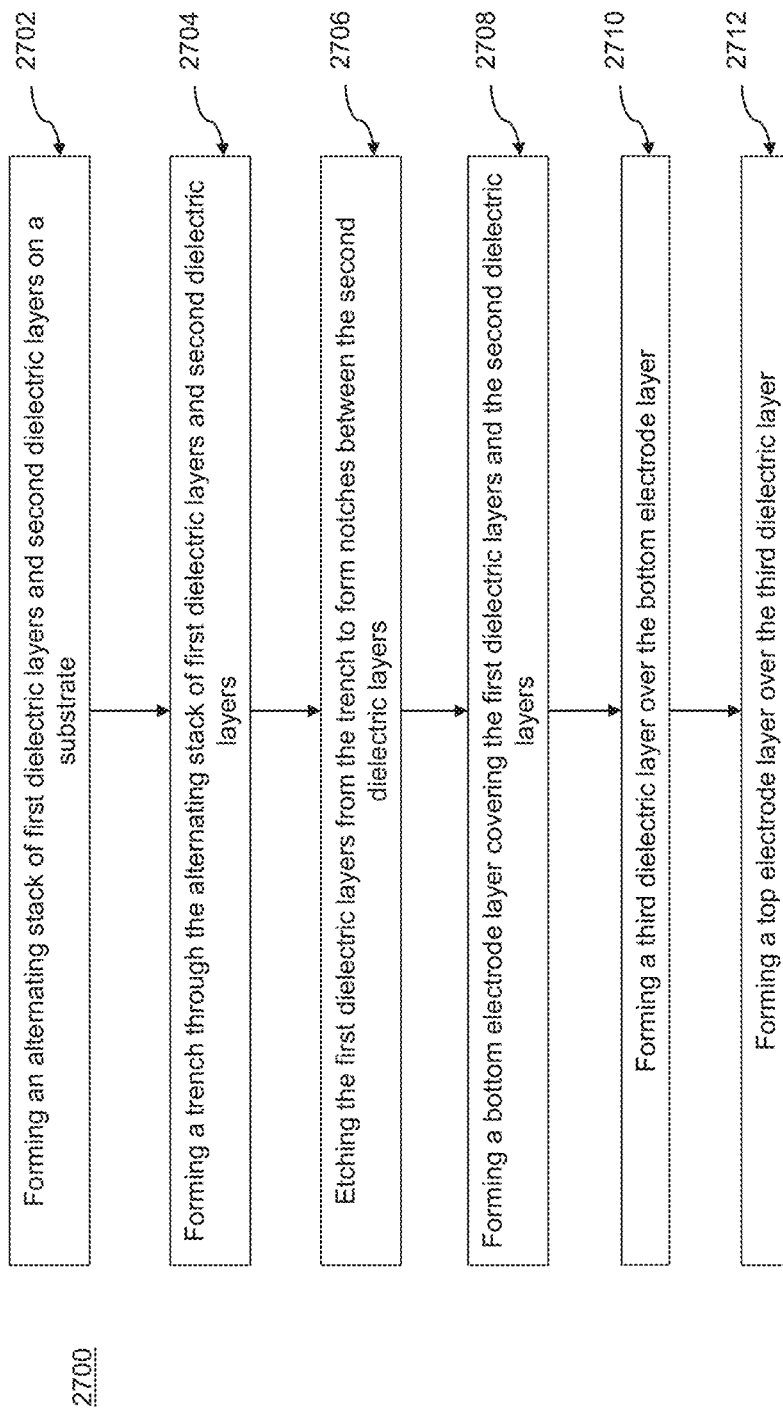
FIG. 27 is a flowchart illustrating operations of a method of manufacturing a capacitor structure, according to various embodiments.

FIG. 27 is a flowchart illustrating operations of a method 2700 of manufacturing a capacitor structure, according to various embodiments. In operation 2702, the method 2700 may include forming an alternating stack of first dielectric layers 302L and second dielectric layers 304L on a substrate 202 (e.g., see FIGS. 3 and 10 to 12). In operation 2704, the method 2700 may further include forming a trench 402 through the alternating stack of first dielectric layers 302L and second dielectric layers 304L. In operation 2706, the method 2700 may include performing a selective etching of the first dielectric layers 302 from the trench 402 to form notches 502 between the second dielectric layers 304, and in operation 2708, the method 2700 may include forming a bottom electrode 602 covering the first dielectric layers 302 and the second dielectric layers 304. In operation 2710, the method 2700 may include forming a third dielectric layer 802 over the bottom electrode 602, and in operation 2712, the method 2700 may include forming a top electrode 902 over the third dielectric layer 802.

The method 2700 may further include forming interconnect structures 204 in an interconnect structure (e.g., first metal interconnect structures (142, 144, 146, 148) in FIG. 1) within the substrate 202, and forming the trench 402 further comprises exposing the interconnect structure 204. Further, forming the bottom electrode 602 may include conductively coupling the bottom electrode 602 to the interconnect structure 204 within the interconnect structure. The method 2700 may further include forming a forth dielectric layer (e.g., dielectric fill material 1402; see FIGS. 14 and 15) over the top electrode 902 such that a bottommost portion 1406 of the forth dielectric layer is lower than a bottommost surface 1408 of the second dielectric layers 304.

The method 2700 may further include forming the top electrode 902 such that the top electrode layer includes portions extending into the notches 502 such that a width 906 (e.g., see FIG. 9) of a bottom surface of the top electrode 902 is greater than a width 518 (e.g., see FIG. 5) of the trench 402 (e.g., see FIG. 4). The method 2700 may further include patterning the bottom electrode layer 602L before forming the third dielectric layer 802. As described above with reference to FIG. 7, the process of patterning the bottom electrode layer 602L may thereby form gaps 702 between portions of the conductive layer 602L in adjacent trenches 402. As such, the patterned conductive layer 602L may form the bottom electrode 602 for various capacitor structures (e.g., see FIGS. 9, 14, and 15) to be formed subsequently.

In further embodiments, the method may include forming the top electrode in two or more processes. For example, as shown in FIG. 16, the method may include forming a first portion 902 of the top electrode over the third dielectric layer 802, followed by removing the first dielectric layers 302 and the second dielectric layers 304 to expose a first sidewall of the bottom electrode 602 opposite to a second sidewall of the bottom electrode that is in contact with the third dielectric layer 802, as shown in FIG. 17. The method may further include forming a fourth dielectric layer 1802 over the first sidewall of the bottom electrode 602 (e.g., see FIG. 17), and forming a second portion 1902 of the top electrode over the fourth dielectric layer 1802 (e.g., see FIG. 19) such that the first portion 902 of the top electrode and the second portion 1902 of the top electrode are electrically connected.

Referring to all drawings and according to various embodiments of the present disclosure, a capacitor structure (900, 1400, 1500, 1900, 2100, 2300, 2600) is provided. The capacitor structure (900, 1400, 1500, 1900, 2100, 2300, 2600) may include a support structure 500 (e.g., see FIG. 5) including a plurality of elongated structures 512 each extending along a longitudinal direction (e.g., into the plane of FIG. 5 (i.e., direction Y in FIG. 5), a transverse direction (i.e., direction X in FIG. 5), and a vertical direction (i.e., direction Z in FIG. 5), wherein each of the plurality of elongated structures 512 may include an alternating dielectric stack of first dielectric layers 302 and second dielectric layers 304; a bottom electrode 602 formed over the support structure 500; a third dielectric layer 802 formed over the bottom electrode 602; and a top electrode 902 formed over the third dielectric layer 802.

Each of the first dielectric layers 302 extends along the longitudinal direction and may include a first width W1 504 along the transverse direction and a first height H1 506 along the vertical direction, and each of the second dielectric layers 304 extends along the longitudinal direction and may include a second width W2 508 along the transverse direction and a second height H2 510 along the vertical direction.

In various embodiments, the first width W1 504 may be less than the second width W2 508 such that each of the plurality of elongated structures 512 include walls including a corrugated width profile as a function of distance along the vertical direction. The corrugated width profile may include a plurality of notches 502 (e.g., see FIG. 5) formed between adjacent ones of the second dielectric layers 304, and each of the plurality of notches 502 may be covered by a first portion of the bottom electrode including a first thickness T1 604 (e.g., see FIG. 6), a second portion of the third dielectric layer 802 including a second thickness T2 804 (e.g., see FIG. 8), and a third portion of the top electrode including a third thickness T3 904 (e.g., see FIG. 9).

Each of the plurality of notches 502 may include a third width W3 516 that may be approximately equal to a difference W3=W2−W1 between the second width W2 508 and the first width W1 504, and each notch 502 may include a height that may be approximately equal to the first height H1. In various embodiments, the first width W1 504 may be greater than or approximately equal to 10 nm and the third width W3 516 may be greater than or approximately equal to 15 nm. In various embodiments, the third width W3 516 may satisfy W3>T1+T2+T3, and the height satisfies H1>2 T1+2 T2+T3.

The support structure 500 may further include a substrate 202 including interconnect structures 204, and the plurality of elongated structures 512 may be formed on the substrate 202 such that each of the plurality of elongated structures 512 may have a third height H3 514 (e.g., see FIG. 5). The interconnect structures 204 may be located between adjacent ones of the plurality of elongated structures 512 and may be conductively coupled to the bottom electrode 602 (e.g., see FIG. 6), and adjacent ones of the plurality of elongated structures 512 may be separated by a fourth width W4 518 (e.g., see FIG. 5). The interconnect structures 204 may each have a fifth width W5 520 that may be less than the fourth width W4 518. In various embodiments, the fourth width W4 518 may be greater than or approximately equal to 20 nm and the third dielectric layer 802 may include a high-k dielectric material.

In further embodiments, a capacitor structure (900, 1400, 1500, 1900, 2100, 2300, 2600) may include a substrate 202 and a plurality of elongated structures 512 (e.g., see FIG. 5) formed on the substrate 202, each of the elongated structures 512 extending along a longitudinal direction (e.g., into the plane of FIGS. 9, 14, 15, 19, 21, 23, and 26), a transverse direction (e.g., the X direction), and a vertical direction (e.g., the Z direction), wherein each of the plurality of elongated structures 512 may include a corrugated width profile (e.g., see FIG. 5) as a function of distance along the vertical direction.

The plurality of elongated structures 512 may include a first height 514, and wherein adjacent ones of the plurality of elongated structures 512 may be separated from one another by a first width 518. The capacitor structure (900, 1400, 1500, 1900, 2100, 2300, 2600) may include a bottom electrode 602 formed over the substrate 202 and elongated structures 512; a first dielectric layer 802 formed over the bottom electrode 602; and a top electrode 902 formed over the first dielectric layer 802.

The elongated structures 512 may each further include an alternating stack of second dielectric layers 302 and third dielectric layers 304, with each of the second dielectric layers 302 extending along the longitudinal direction and including a second width 504 along the transverse direction and a second height 506 along the vertical direction. Each of the third dielectric layers 304 may extend along the longitudinal direction and may include a third width 508 along the transverse direction and a third height 510 along the vertical direction. The second width 504 may be less than the third width 508 such that notches 502 are formed between adjacent third dielectric layers 304. Further, the bottom electrode 602, the first dielectric layer 802, and the top electrode 902 may each have portions extending into the notches (e.g., see FIG. 9).

The interconnect structures 204 formed in the substrate 202 may be located between adjacent ones of the plurality of elongated structures 512 (e.g., see FIG. 5). Further, the interconnect structures 204 may be conductively coupled to the bottom electrode 602, and the interconnect structures may have a fourth width 520 such that the fourth width 520 may be less than the first width 518. In certain embodiments, the capacitor structure (1400 and 1500) may include a fourth dielectric layer (e.g., dielectric fill material 1402) formed over the top electrode 902.

In further embodiments, a capacitor structure (2100, 2300) may include a first electrode 602, a second electrode 1902, and a capacitor dielectric layer (802, 1802) between the first electrode 602 and the second electrode 1902, such that the capacitor dielectric layer (802, 1802) extends along opposite sidewalls of the first electrode 602, and such that a portion of the first electrode 602 is located between a first portion 2110a of the second electrode 1902 and a second portion 2110b of the second electrode (e.g., see FIGS. 21 and 23). In further embodiments, a capacitor structure (1900, 2600) may further include a disconnected conductor 1702 separated from the first electrode 602 by the capacitor dielectric layer 802.

Various disclosed capacitor structures and methods of making the same provide advantages over existing capacitor structures. In this regard, a capacitor structure (900, 1400, 1500, 1900, 2100, 2300, 2600) is provided that may be formed in a BEOL process and may be incorporated with other BEOL circuit components such as TFT devices. As such, the disclosed capacitor structure may include materials that may be processed at low temperatures and thus, may not damage previously fabricated devices (e.g., FEOL and MEOL devices). The disclosed capacitor structure may include a substrate 202 that may be formed in a BEOL process.

As such, the substrate 202 may be a dielectric layer (e.g., an inter-layer dielectric or insulating matrix layer 150 from FIG. 1) that may embed one or more interconnect structures 204. The one or more interconnect structures 204 may be electrically connected to various other interconnect structures (e.g., first metal interconnect structures (142, 144, 146, 148) in FIG. 1) formed below the substrate 202. The disclosed capacitor structure is formed in a rectangular geometry and includes a top electrode that may easily be connected to additional structures formed above the capacitor structure.

The disclosed embodiment capacitor structures include a fin-like geometry extending in a longitudinal direction. The capacitance may be tuned by choosing an appropriate length along the longitudinal direction. A large capacitance may be achieved by choosing a sufficiently long length along the longitudinal direction. An increased capacitance may, in turn, increase a dynamic random access memory (DRAM) device sensing margin in a DRAM device that includes the disclosed capacitor structure. A larger capacitance may also increase data retention of the DRAM device.

The foregoing outlines features of several embodiments so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure.

What is claimed is:

1. A capacitor structure, comprising:
a support structure comprising a plurality of elongated structures each extending along a longitudinal direction, a transverse direction, and a vertical direction, wherein each of the plurality of elongated structures comprises an alternating dielectric stack comprising first dielectric layers and second dielectric layers;
a bottom electrode formed over the support structure;
a third dielectric layer formed over the bottom electrode; and
a top electrode formed over the third dielectric layer;

wherein each of the plurality of elongated structures comprises a corrugated width profile as a function of distance along the vertical direction, the corrugated width profile comprising a plurality of notches formed between adjacent ones of the second dielectric layers, and wherein each of the plurality of notches comprises a third width W3, wherein the third width W3 satisfies W3>T+T2+T3, wherein T1, T2, and T3 respectively represent thicknesses of a first portion of the bottom electrode, a second portion of the third dielectric layer, and a third portion of the top electrode covering each notch, and wherein a first height H1 of the first dielectric layers satisfies H1>2 T1+2 T2+T3, and wherein a plurality of gaps are defined in the bottom electrode, each gap positioned between two horizontal sections at a top of a respective elongated structure in the vertical direction.

2. The capacitor structure of claim 1, wherein each of the first dielectric layers extends along the longitudinal direction and comprises a first width W1 along the transverse direction, and wherein each of the second dielectric layers extends along the longitudinal direction and comprises a second width W2 along the transverse direction and a second height H2 along the vertical direction.

3. The capacitor structure of claim 2, wherein the first width W1 is less than the second width W2.

4. The capacitor structure of claim 3, wherein the third width W3 is approximately equal to a difference W3=W2−W1 between the second width W2 and the first width W1, and wherein each notch comprises a height that is approximately equal to the first height H1.

5. The capacitor structure of claim 4, wherein the first width W1 is greater than or approximately equal to 10 nm and the third width W3 is greater than or approximately equal to 15 nm.

6. The capacitor structure of claim 1, wherein the support structure further comprises a substrate comprising interconnect structures, wherein the interconnect structures are located between adjacent ones of the plurality of elongated structures and are conductively coupled to the bottom electrode, and wherein adjacent ones of the plurality of elongated structures are separated by a fourth width W4.

7. The capacitor structure of claim 6, wherein the interconnect structures each have a fifth width W5 that is less than the fourth width W4.

8. The capacitor structure of claim 6, wherein W4 is greater than or approximately equal to 20 nm.

9. The capacitor structure of claim 1, wherein the third dielectric layer comprises a high-k dielectric material.

10. A capacitor structure, comprising:
a first electrode;
a second electrode; and
a capacitor dielectric layer between the first electrode and the second electrode, wherein the capacitor dielectric layer extends along opposite sidewalls of the first electrode, and wherein a portion of the first electrode is located between a first portion of the second electrode and a second portion of the second electrode, wherein the capacitor dielectric layer comprises a corrugated width profile as a function of distance along a vertical direction, the corrugated width profile comprising a plurality of notches,
wherein each of the plurality of notches comprises a third width W3, wherein the third width W3 satisfies W3>T1+T2+T3, wherein T1, T2, and T3 respectively represent thicknesses of a first portion of the first electrode, a second portion of the capacitor dielectric layer, and a third portion of the second electrode, and
wherein a plurality of gaps are defined in the first electrode, each gap positioned between two horizontal sections at a top of the first electrode in the vertical direction.

11. The capacitor structure of claim 10, wherein the first electrode and the second electrode each comprise an elongated structure extending along a longitudinal direction, a transverse direction, and a vertical direction, wherein each of the plurality of elongated structures comprises the corrugated width profile having a width in the transverse direction that varies as a function of distance along the vertical direction.

12. The capacitor structure of claim 11, wherein the first electrode, the capacitor dielectric layer, and the second electrode each have portions extending into the notches.

13. The capacitor structure of claim 10, further comprising a disconnected conductor separated from the first electrode by the capacitor dielectric layer.

14. A capacitor structure, comprising:
a support structure comprising a plurality of elongated structures each extending along a longitudinal direction and a vertical direction, wherein each of the plurality of elongated structures comprises an alternating dielectric stack comprising first dielectric layers and second dielectric layers;
a first electrode formed over the support structure; and
a second electrode spaced apart from the first electrode,
wherein each of the plurality of elongated structures comprises a corrugated width profile as a function of distance along the vertical direction, the corrugated width profile comprising a plurality of notches formed between adjacent ones of the second dielectric layers,
wherein each of the plurality of notches comprises a third width W3, wherein the third width W3 satisfies W3>T1+T2+T3, wherein T1, T2, and T3 respectively represent thicknesses of a first portion of the first electrode, a second portion of the dielectric stack, and a third portion of the second electrode, and
wherein a first height H1 of the first dielectric layers satisfies H1>2 T1+2 T2+T3, and wherein a plurality of gaps are defined in the first electrode, each gap positioned between two horizontal sections at a top of a respective elongated structure in the vertical direction.

15. The capacitor structure of claim 14, wherein the support structure further comprises a substrate comprising interconnect structures.

16. The capacitor structure of claim 15, wherein the interconnect structures are located between adjacent ones of the plurality of elongated structures.

17. The capacitor structure of claim 15, wherein the interconnect structures are conductively coupled to the first electrode.

18. The capacitor structure of claim 14, wherein the third dielectric layer is formed over the first electrode.

19. The capacitor structure of claim 14, wherein the first dielectric layers comprise silicon dioxide, and the second dielectric layers comprise silicon nitride, silicon carbide, or combinations thereof.

20. The capacitor structure of claim 14, wherein each of the plurality of elongated structures comprises walls having a corrugated width profile as a function of vertical distance, and wherein the notches in the corrugated width profile are formed by selectively etching portions of the first dielectric layers.

* * * * *